US012777645B2

(12) United States Patent
Oh et al.

(10) Patent No.: US 12,777,645 B2
(45) Date of Patent: Oct. 27, 2026

(54) METHOD OF MANUFACTURING MEMORY DEVICE HAVING A SOURCE LAYER

(71) Applicant: SK hynix Inc., Icheon-si (KR)

(72) Inventors: Jae Young Oh, Icheon-si (KR); Dong Hwan Lee, Icheon-si (KR); Eun Seok Choi, Icheon-si (KR)

(73) Assignee: SK hynic Inc., Icheon-si (KR)

( * ) Notice: Subject to any disclaimer, the term of this patent is extended or adjusted under 35 U.S.C. 154(b) by 435 days.

(21) Appl. No.: 18/356,033

(22) Filed: Jul. 20, 2023

(65) Prior Publication Data

US 2024/0260265 A1 Aug. 1, 2024

(30) Foreign Application Priority Data

Jan. 31, 2023 (KR) ........................ 10-2023-0012626

(51) Int. Cl.
*H10B 43/27* (2023.01)
*H10B 43/40* (2023.01)

(52) U.S. Cl.
CPC ............ *H10B 43/27* (2023.02); *H10B 43/40* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46; H10B 41/50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10;
(Continued)

(56) References Cited

U.S. PATENT DOCUMENTS

| | | | | |
|---|---|---|---|---|
| 11,158,622 | B1 * | 10/2021 | Zhang | G11C 16/0483 |
| 2018/0358372 | A1 * | 12/2018 | Hwang | H10B 43/50 |

(Continued)

FOREIGN PATENT DOCUMENTS

| | | | |
|---|---|---|---|
| KR | 1020220028916 | A | 3/2022 |
| KR | 1020220033781 | A | 3/2022 |
| KR | 1020220151533 | A | 11/2022 |

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

A method of manufacturing a memory device includes forming a preliminary gate stack structure including interlayer insulating layers and sacrificial patterns stacked on a substrate, a channel hole passing through the preliminary gate stack structure, a memory layer extending along a surface of the channel hole, and a channel layer extending along a surface of the memory layer. The method also includes forming a gate stack structure by replacing the plurality of sacrificial patterns with a plurality of conductive patterns, removing the substrate, removing a portion of the memory layer to expose a portion of the channel layer, forming an upper insulating layer to cover a portion of an exposed channel layer and the gate stack structure, removing a portion of the upper insulating layer to expose the portion of the channel layer, and forming a source layer covering the portion of the exposed channel layer.

13 Claims, 22 Drawing Sheets

(58) Field of Classification Search
CPC ........ H10B 51/20; H10B 51/30; H10B 51/40; H10B 51/50
See application file for complete search history.

(56) References Cited

U.S. PATENT DOCUMENTS

2021/0296358 A1* 9/2021 Kanamori .............. H10B 43/27
2021/0375828 A1* 12/2021 Zhang ................... H10W 90/00

* cited by examiner

METHOD OF MANUFACTURING MEMORY DEVICE HAVING A SOURCE LAYER

CROSS-REFERENCE TO RELATED APPLICATION

The present application claims priority under 35 U.S.C. § 119(a) to Korean patent application number 10-2023-0012626 filed on Jan. 31, 2023, in the Korean Intellectual Property Office, the entire disclosure of which is incorporated by reference herein.

BACKGROUND

1. Technical Field

Various embodiments of the present disclosure relate to a memory device and a manufacturing method thereof, and more particularly, to a three-dimensional memory device and a method of manufacturing the same.

2. Related Art

A memory device may be classified as a volatile memory device that loses stored data when a power supply is blocked and a non-volatile memory device that retains stored data even when a power supply is blocked.

A non-volatile memory device may include NAND flash memory, NOR flash memory, resistive random-access memory (ReRAM), phase-change random-access memory (PRAM), magnetoresistive random-access memory (MRAM), ferroelectric random-access memory (FRAM), and spin transfer torque random-access memory (STT-RAM).

A NAND flash memory system may include a memory device configured to store data and a controller configured to control the memory device. The memory device may include a memory cell array storing data and peripheral circuits configured to perform a program, read, or erase operation in response to a command transferred from the controller.

The memory cell array may include a plurality of memory blocks. Each of the memory blocks may include a plurality of memory cells.

Various methods for reducing different types of defects which may occur during processes for manufacturing a memory device are being sought.

SUMMARY

Some embodiments of present disclosure are directed to a memory device capable of improving reliability and a method of manufacturing the memory device.

According to an embodiment, a method of manufacturing a memory device may include: forming a preliminary gate stack structure including a plurality of interlayer insulating layers and a plurality of sacrificial patterns stacked alternately with each other on a substrate, a channel hole passing through the preliminary gate stack structure and extending into the substrate, a memory layer extending along a surface of the channel hole, and a channel layer extending along a surface of the memory layer; forming a gate stack structure by replacing the plurality of sacrificial patterns with a plurality of conductive patterns; removing the substrate to expose the memory layer; removing a portion of the memory layer to expose a portion of the channel layer; forming an upper insulating layer to cover a portion of an exposed channel layer and the gate stack structure; removing a portion of the upper insulating layer to expose the portion of the channel layer; and forming a source layer covering the portion of the exposed channel layer and the upper insulating layer.

According to an embodiment, a method of manufacturing a memory device may include: forming a preliminary gate stack structure including a plurality of interlayer insulating layers and a plurality of sacrificial patterns stacked alternately with each other on a substrate, a channel hole passing through the preliminary gate stack structure and extending into the substrate, a memory layer extending along a surface of the channel hole, and a channel layer extending along a surface of the memory layer; forming a gate stack structure by replacing the plurality of sacrificial patterns with a plurality of conductive patterns; removing a portion of the memory layer and at least a portion of the substrate to expose a portion of the channel layer; forming an upper insulating layer to cover a portion of an exposed channel layer and the gate stack structure; removing a portion of the upper insulating layer to expose the portion of the channel layer; and forming a source layer covering the portion of the exposed channel layer and the upper insulating layer.

According to an embodiment, a memory device may include: a gate stack structure including a plurality of interlayer insulating layers and a plurality of conductive patterns stacked alternately with each other and a channel hole passing through the plurality of interlayer insulating layers and the plurality of conductive patterns; a channel layer disposed in the channel hole and including a protrusion protruding out from the channel hole; a memory layer interposed between the channel layer and the gate stack structure; a spacer insulating pattern surrounding a sidewall of the protrusion of the channel layer and overlapping the memory layer; and a source layer covering the gate stack structure and the spacer insulating pattern and contacting the protrusion of the channel layer.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

While terms such as "first," "second," and "third" herein may be used to distinguish one component from another, the order or number of components of the present disclosure must not be understood as being limited to the above terms.

It will be understood that when an element is referred to as being "connected" or "coupled" to another element, it can be directly connected or coupled to the other element or intervening elements may also be present.

Figure 1:
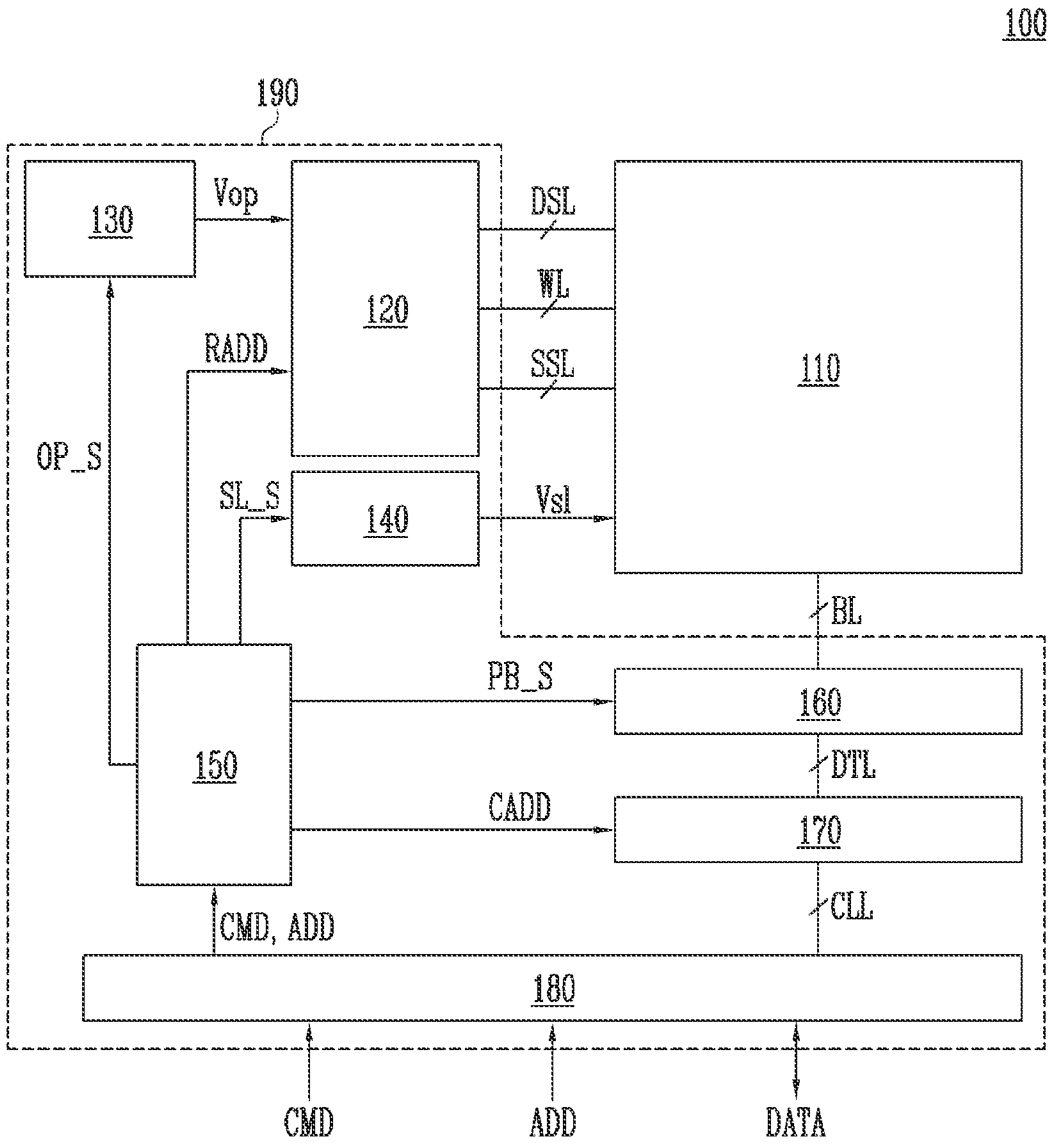
FIG. 1 is a is a diagram illustrating a memory device according to an embodiment of the present disclosure.

FIG. 1 is a diagram illustrating a memory device 100 according to an embodiment of the present disclosure.

Referring to FIG. 1, the memory device 100 may include a peripheral circuit 190 and a memory cell array 110.

The peripheral circuit 190 may perform a program operation and a verify operation for storing data in the memory cell array 110, a read operation for outputting the data stored in the memory cell array 110, or an erase operation for erasing the data stored in the memory cell array 110. The peripheral circuit 190 may include a voltage generation circuit 130, a row decoder 120, a source line driver 140, a control circuit 150, a page buffer 160, a column decoder 170, and an input/output circuit 180.

The memory cell array 110 may include a plurality of memory cells that store data. According to an embodiment, the memory cell array 110 may include a three-dimensional memory cell array. The plurality of memory cells may store single-bit data or multi-bit data of two or more bits according to a program method. The plurality of memory cells may form a plurality of strings. Memory cells which are included in each of the strings may be electrically coupled to each other through a channel. Channels included in the strings may be coupled to the page buffer 160 through bit lines BL.

The voltage generation circuit 130 may generate various operating voltages Vop for a program operation, a read operation, or an erase operation in response to an operation signal OP_S. For example, the voltage generation circuit 130 may selectively generate and output various operating voltages Vop that include a program voltage, a verify voltage, a pass voltage, a read voltage, and an erase voltage.

The row decoder 120 may be coupled to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD.

The source line driver 140 may transfer a source voltage Vsl to the memory cell array 110 in response to a source line control signal SL_S. For example, the source voltage Vsl may be transferred to the memory cell array 110 through a source layer coupled to the memory cell array.

The control circuit 150 may output the operation signal OP_S, the row address RADD, a source line control signal SL_S, a page buffer control signal PB_S, and a column address CADD in response to a command CMD and an address ADD.

The page buffer 160 may be coupled to the memory cell array 110 through the bit lines BL. The page buffer 160 may temporarily store data DATA received through the plurality of bit lines BL in response to the page buffer control signal PB_S. The page buffer 160 may sense voltages or currents in the plurality of bit lines BL during a read operation.

The column decoder 170 may transfer the data DATA, which is input from the input/output circuit 180, to the page buffer 160, or may transfer the data DATA, which is stored in the page buffer 160, to the input/output circuit 180 in response to the column address CADD. The column decoder 170 may exchange the data DATA with the input/output circuit 180 through column lines CLL and may exchange the data DATA with the page buffer 160 through data lines DTL.

The input/output circuit 180 may transfer the command CMD and the address ADD, which are transferred from the external device (e.g., a controller) coupled to the memory device 100, to the control circuit 150, and may output the data received from the column decoder 170 to the external device.

Figure 2:
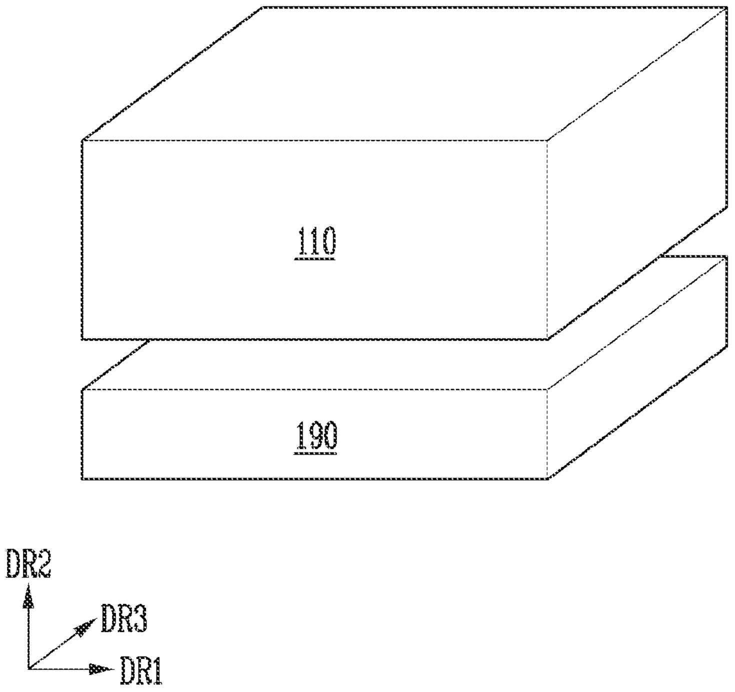
FIG. 2 is a diagram illustrating the arrangement of a memory cell array and a peripheral circuit shown in FIG. 1.

FIG. 2 is a diagram illustrating the arrangement of the memory cell array 110 and the peripheral circuit 190 shown in FIG. 1.

Referring to FIG. 2, the memory cell array 110 may overlap the peripheral circuit 190 in a vertical direction. The peripheral circuit 190 and the memory cell array 110 may be arranged over a first surface of a substrate that faces the vertical direction. The substrate may be in the form of a flat panel which crosses with the vertical direction. For example, the first surface of the substrate may extend on an X-Y plane. Hereinafter, embodiments of the present disclosure will be described based on a first direction DR1, a second direction DR2, and a third direction DR3. The first direction DR1 and the third direction DR3 may be defined as directions in which the first surface of the substrate extends. In addition, the first direction DR1 and the third direction DR3 may cross each other. The second direction DR2 may be defined as a direction crossing the first surface of the substrate, and may be defined as a vertical direction.

The memory cell array 110 may include memory cells which store data. The memory cells may be coupled in series to each other through a channel layer (e.g., a channel layer CH shown in FIG. 4K, 5D or FIG. 6B) to form a memory cell string. The channel layer may be disposed between a bit line and a source layer and electrically coupled to the bit line and the source layer.

A first structure which includes the memory cell array 110 and the bit line and a second structure which includes the peripheral circuit 190 may be provided by separate processes. The first structure and the second structure which are provided separately may be structurally connected to each other by a bonding process and electrically coupled to each other. The source layer may be formed after the bonding process.

Figure 3:
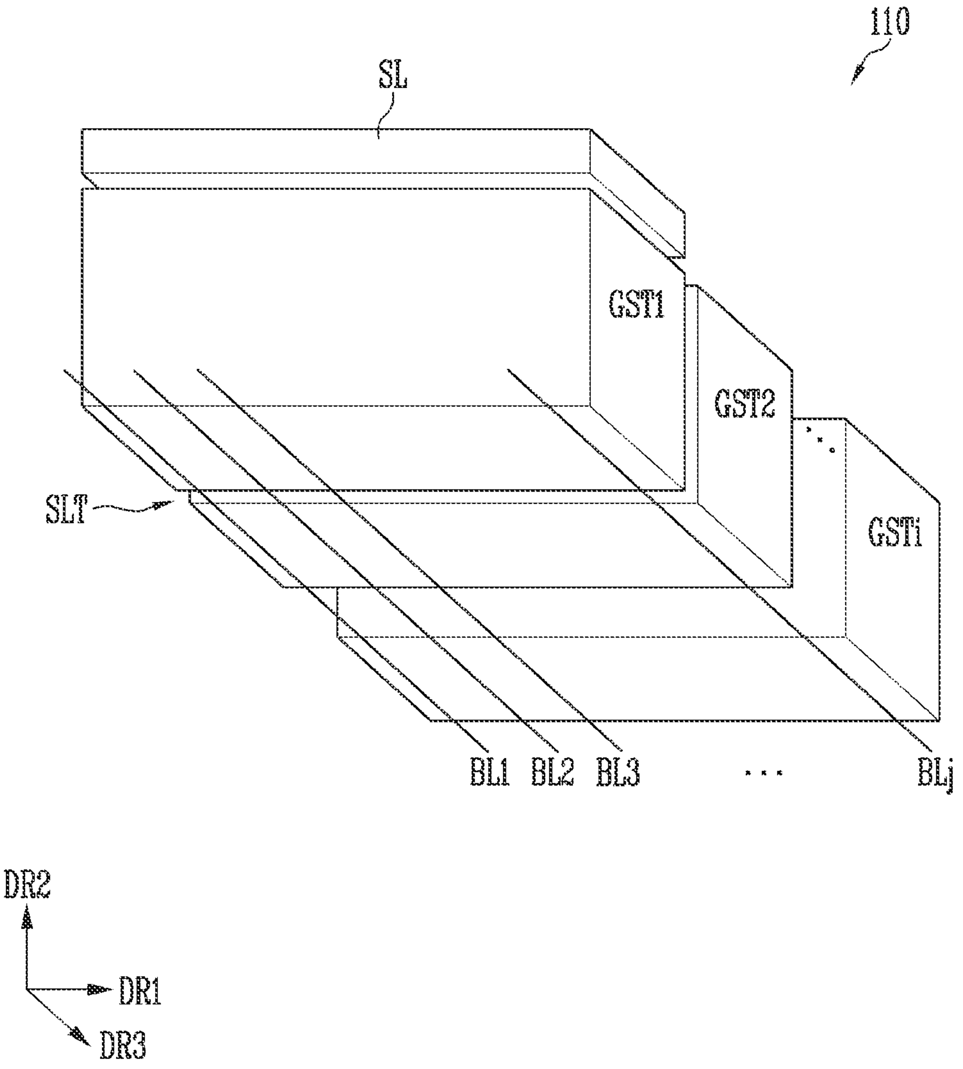
FIG. 3 is a diagram illustrating a memory cell array shown in FIG. 2.

FIG. 3 is a diagram illustrating the memory cell array 110 shown in FIG. 2.

Referring to FIG. 3, the memory cell array 110 may include first to ith gate stack structures GST1 to GSTi, where i is a positive integer. The first to ith gate stack structures GST1 to GSTi may be spaced apart from each other in the third direction DR3. The first to ith gate stack structures GST1 to GSTi may include conductive patterns (e.g., third material layers 13 in FIG. 4K, 5D, or 6B) which extend in the first direction DR1 and the third direction DR3. The conductive patterns may be spaced apart in the second direction DR2 and stacked on top of each other. The first to ith gate stack structures GST1 to GSTi may further include conductive layers and interlayer insulating layers (e.g., first material layers 11 shown in FIG. 4K, 5D, or 6B) which are arranged alternately with each other in the second direction DR2. Each of the first to ith gate stack structures GST1 to GSTi may include holes which extend in the second direction DR2. The memory cell array 110 may further include a channel layer (e.g., a channel layer CH shown in FIG. 4K, 5D, or 6B), and a memory layer (e.g., a memory layer ML shown in FIG. 4K, 5D, or 6B) which are disposed in each of the holes.

Each of the first to ith gate stack structures GST1 to GSTi may be disposed between first to jth bit lines BL1 to BLj, where j is a positive integer, and a source layer SL. The first to ith gate stack structures GST1 to GSTi may be separated from each other by slits SLT. The first to jth bit lines BL1 to BLj may extend to overlap the first to ith gate stack structures GST1 to GSTi. According to an embodiment, the first to jth bit lines BL1 to BLj may extend in the third direction DR3. The first to jth bit lines BL1 to BLj may be coupled to channel layers corresponding thereto. The source layer SL may be partitioned to control the memory cell array 110 in various units. According to an embodiment, the source layer SL may be partitioned to control memory cells in the same units as those controlled by each of the first to ith gate stack structures GST1 to GSTi. More specifically, the source layers SL which are separated from each other may individually overlap the first to ith gate stack structures GST1 to GSTi. According to another embodiment, the source layer SL may be divided to simultaneously control memory cells which are controlled by at least two consecutive gate stack structures among the first to ith gate stack structures GST1 to GSTi. More specifically, the source layer SL may extend in the third direction DR3 to overlap the first to ith gate stack structures GST1 to GSTi.

When the above memory cell array 110 is formed, various types of defects may be generated. Hereinafter, a method of manufacturing a memory device according to various embodiments which may prevent deterioration of reliability in an operation caused by defects when the memory cell array 110 is formed will be described.

For convenience of explanation, manufacturing processes associated with a process of forming a peripheral circuit and a bonding process thereof are not described, and a manufacturing method will be described in detail as to a gate stack structure of the memory device and a source layer overlapping the gate stack structure will be described in more detail.

FIGS. 4A to 4K are diagrams illustrating a method of manufacturing a memory device according to an embodiment of the present disclosure.

FIGS. 4A to 4K are cross-sectional diagrams illustrating an embodiment of a method of manufacturing a memory cell array and a bit line.

Figure 4A:
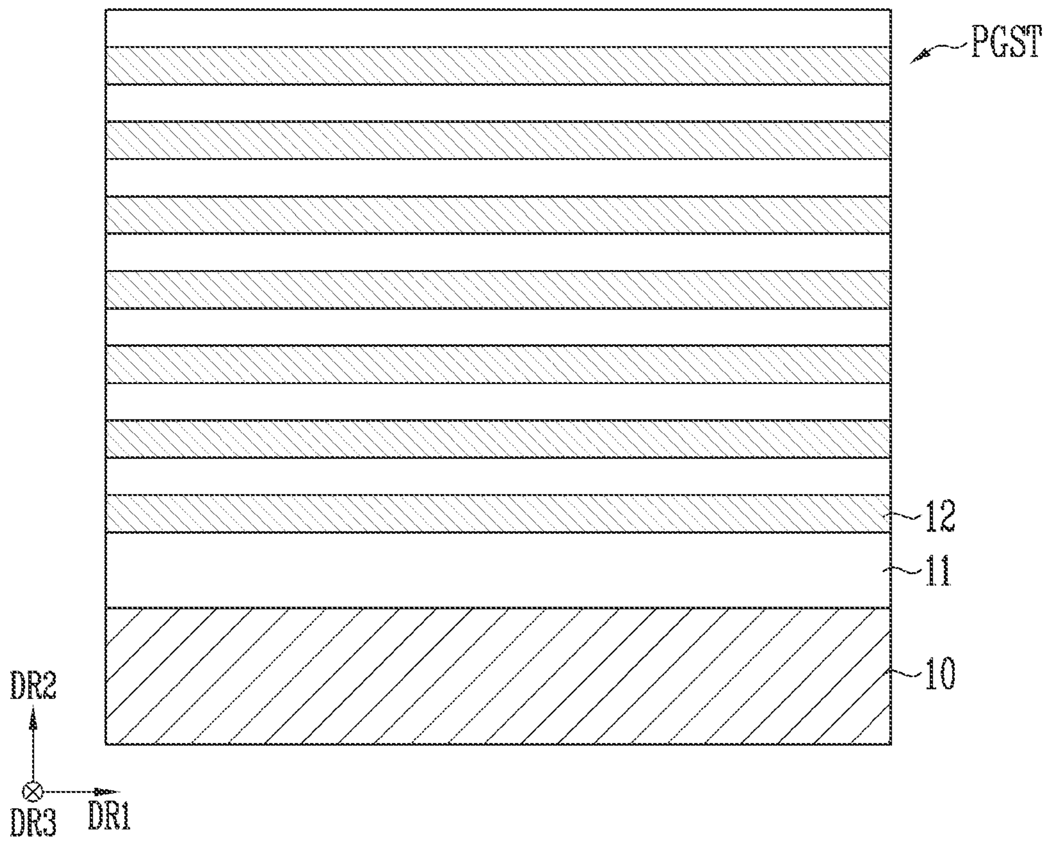
FIGS. 4A to 4K are diagrams illustrating a method of manufacturing a memory device according to an embodiment of the present disclosure.

Referring to FIG. 4A, a method of manufacturing a memory cell array may include stacking first material layers 11 and second material layers 12 alternately with each other on a substrate 10.

The substrate 10 may extend in the first direction DR1 and include a first surface facing the second direction DR2 which is a vertical direction. The first surface of the substrate 10 may extend in the first direction DR1 and the third direction DR3 crossing the first direction DR1. The first material layers 11 and the second material layers 12 may be alternately stacked on the first surface of the substrate 10. The first material layers 11 and the second material layers 12 may be stacked on top of each other in the second direction DR2. According to an embodiment, after the first material layers 11 are stacked on the first surface of the substrate 10, the second material layers 12 may be stacked on top of the first material layers 11. According to an embodiment, the first material layer 11 adjacent to the first surface of the substrate 10, among the first material layers 11, may have a greater thickness than the first material layers 11 stacked on top of the second material layers 12. The second material layers 12 may include a different material from the first material layers 11. According to an embodiment, the second material layers 12 may have a material having an etch selectivity with respect to the first material layers 11. More specifically, the first material layers 11 may include an insulating material such as a silicon oxide layer, and the second material layers 12 may include a sacrificial insulating material such as a silicon nitride layer. The second material layers 12 may be replaced with third material layers which include at least one of a doped semiconductor layer, a metal layer, and a conductive metal nitride layer during subsequent processes.

According to another embodiment, the first material layers 11 may include an insulating material, and the second material layers 12 may 12 may include a conductive material. According to an embodiment, the first material layers 11 may include a silicon oxide layer, and the second material layers 12 may include at least one of a doped semiconductor layer, a metal layer, and a conductive metal nitride layer.

The first material layers 11 and the second material layers 12 which are stacked alternatively over the substrate 10 may be defined as a preliminary gate stack structure PGST. According to an embodiment, the first material layer 11 may be located at the uppermost part of the preliminary gate stack structure PGST.

Figure 4B:
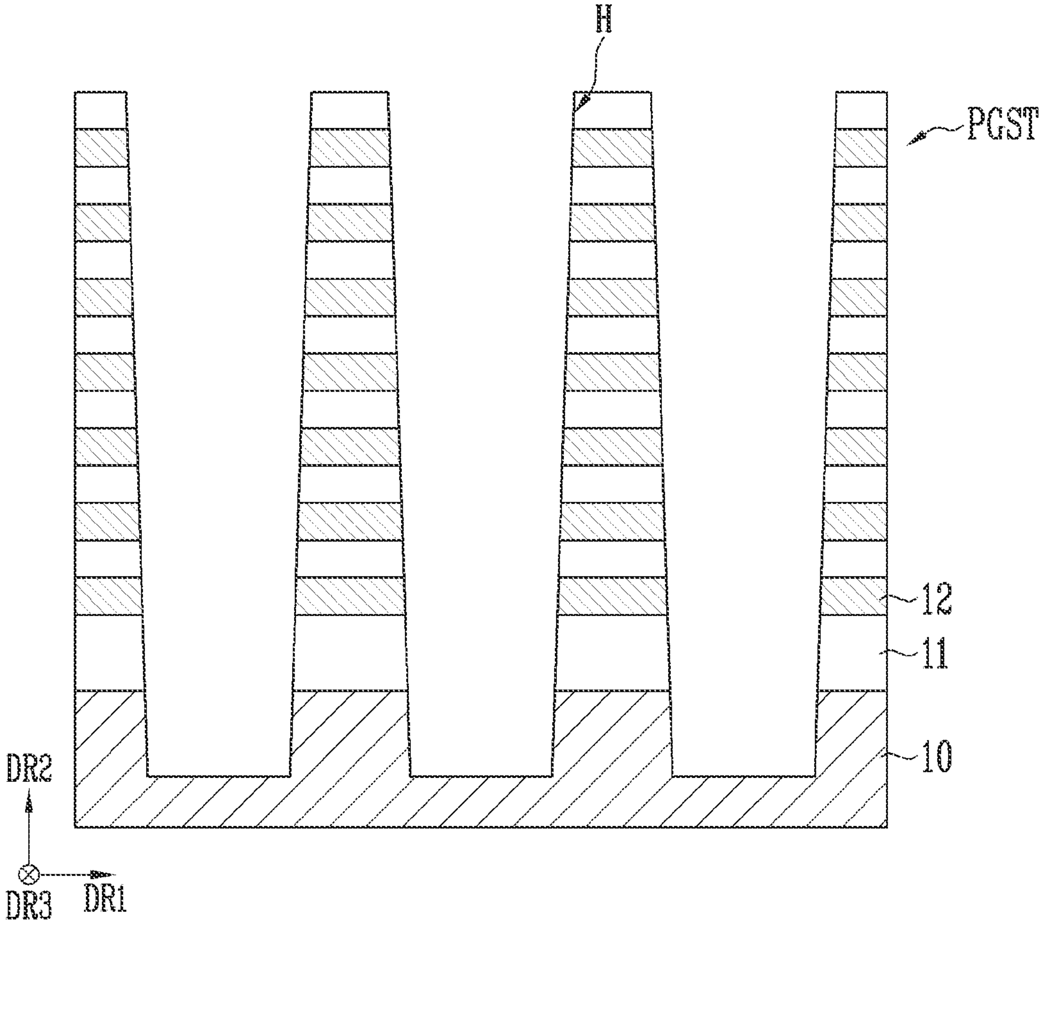

Referring to FIG. 4B, after the preliminary gate stack structure PGST is formed, channel holes H may be formed. The channel holes H may pass through the preliminary gate stack structure PGST and extend into the substrate 10. The channel holes H may extend in the second direction DR2 and may be spaced apart from each other in the first direction DR1 and the third direction DR3. The channel holes H may be formed by removing portions of the substrate 10, the first material layers 11, and the second material layers 12. The substrate 10 may be exposed through bottom surfaces of the channel holes H, and the first material layers 11 and the second material layers 12 may be exposed through sidewalls of the channel holes H.

Each of the channel hole H may have a width which gradually increases in the second direction DR2 away from the substrate 10. However, the width of the channel hole H may vary. According to an embodiment, the width of the channel hole H may be maintained in the second direction DR2.

Figure 4C:
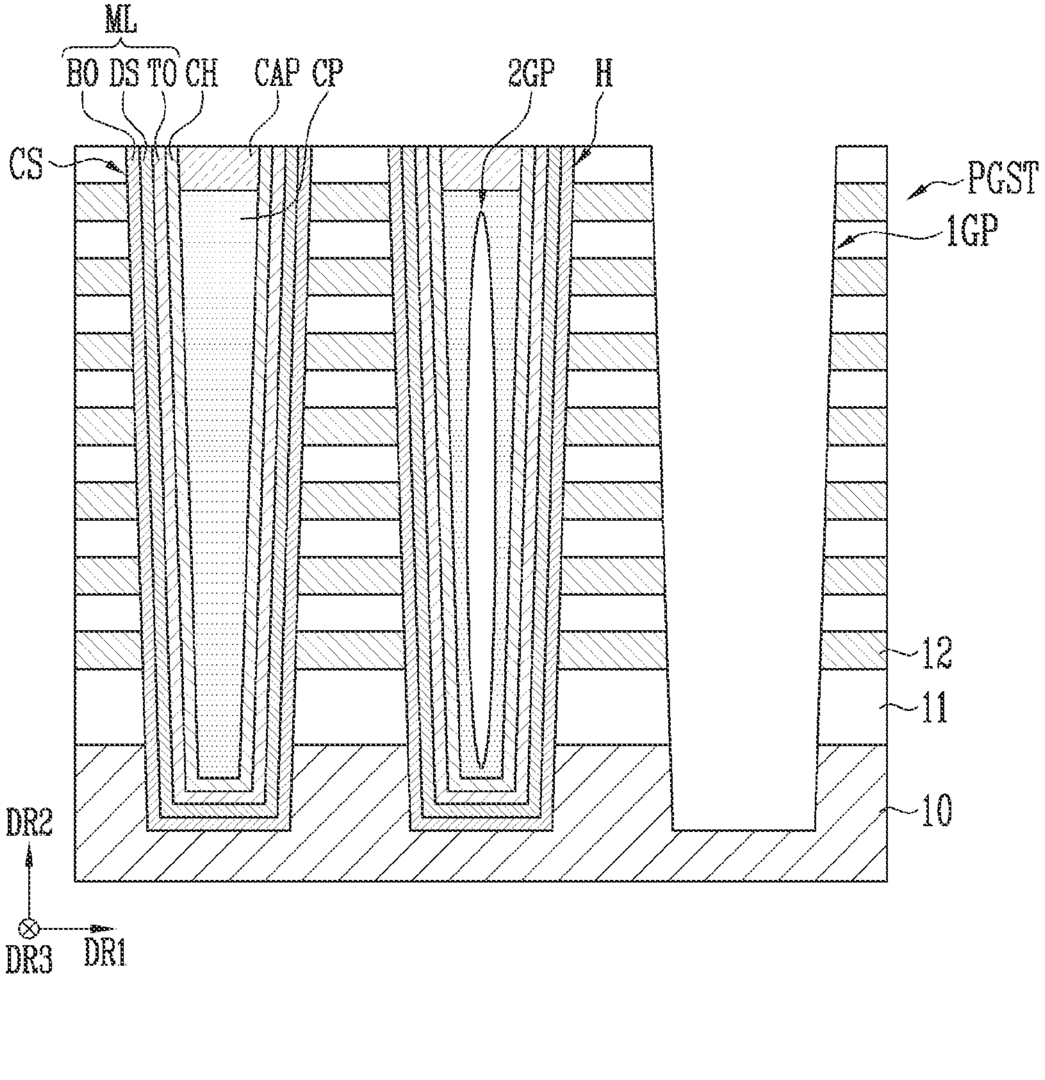

Referring to FIG. 4C, a channel structure CS may be formed in each of the channel holes H. The channel structure CS may include a memory layer ML, the channel layer CH, a core pillar CP, and a capping layer CAP. The memory layer ML and the channel layer CH may be sequentially stacked in the channel hole H. The memory layer ML may include a blocking layer BO, a data storage layer DS, and a tunnel isolation layer TO. The blocking layer BO, the data storage layer DS, and the tunnel isolation layer TO may be stacked sequentially along the channel hole H. The core pillar CP and the capping layer CAP may be disposed in a portion of the channel hole H. The capping layer CAP may be formed to cover the core pillar CP.

The capping layer CAP may include a conductive material. According to an embodiment, the capping layer CAP may include a doped polysilicon layer. According to the above-described processes, the core pillar CP may be formed under the capping layer CAP. The core pillar CP may include an insulating material. According to the above-described processes, the channel layer CH may extend along a sidewall of each of the capping layer CAP and the core pillar CP. The channel layer CH may include a semiconductor material. According to an embodiment, the channel layer CH may include a silicon layer. According to the above-described processes, the memory layer ML may extend along a sidewall of the channel layer CH. The memory layer ML may be formed to surround the channel layer CH. More specifically, the tunnel isolation layer TO may extend along the sidewall of the channel layer CH. The tunnel isolation layer TO may surround the channel layer CH and include an insulating material. According to an embodiment, the tunnel isolation layer TO may include an oxide layer such as a silicon oxide layer. The data storage layer DS may extend along a sidewall of the tunnel isolation layer TO. The data storage layer DS may be formed to surround the tunnel isolation layer TO. The data storage layer DS may include a material which stores data by using various methods, such as using a charge trap layer, a variable resistance layer, nanodots, and the like. According to an embodiment, the data storage layer DS may include a nitride layer which enables charge trapping. The blocking layer BO may extend along a sidewall of the data storage layer DS. The blocking layer BO may surround the data storage layer DS and may include an insulating material. For example, the blocking layer BO may include an oxide layer such as a silicon oxide layer.

At least one gap may be formed when the above-described channel structure CS is formed. For example, a first gap 1GP may be defined because the channel structure CS is not formed in some of the channel holes H. Alternatively, a second gap 2GP may be defined in the channel structure CS. According to embodiments of the present disclosure, subsequent processes may be performed to prevent deterioration of the operational reliability of the memory device by the first gap 1GP or the second gap 2GP even if at least one of the first and second gaps 1GP and 2GP is defined after the channel structure CS is formed.

However, the first gap 1GP is not limited to the shape of shown in FIG. 4C and may have various shapes. According to an embodiment, as shown in FIG. 4C, the first gap 1GP may be defined because none of different layers included in the channel structure CS are formed in some of the channel holes H. Though not shown, according to another embodiment, the first gap may be defined when at least one of the layers included in the channel structure CS is not normally formed in portions of the channel holes H.

The second gap 2GP may be formed in the core pillar CP. The second gap 2GP may be surrounded by a channel layer CH. The shape of the second gap 2GP is not limited to that shown in FIG. 4C and may vary depending on how the core pillar CP is deposited.

Figure 4D:
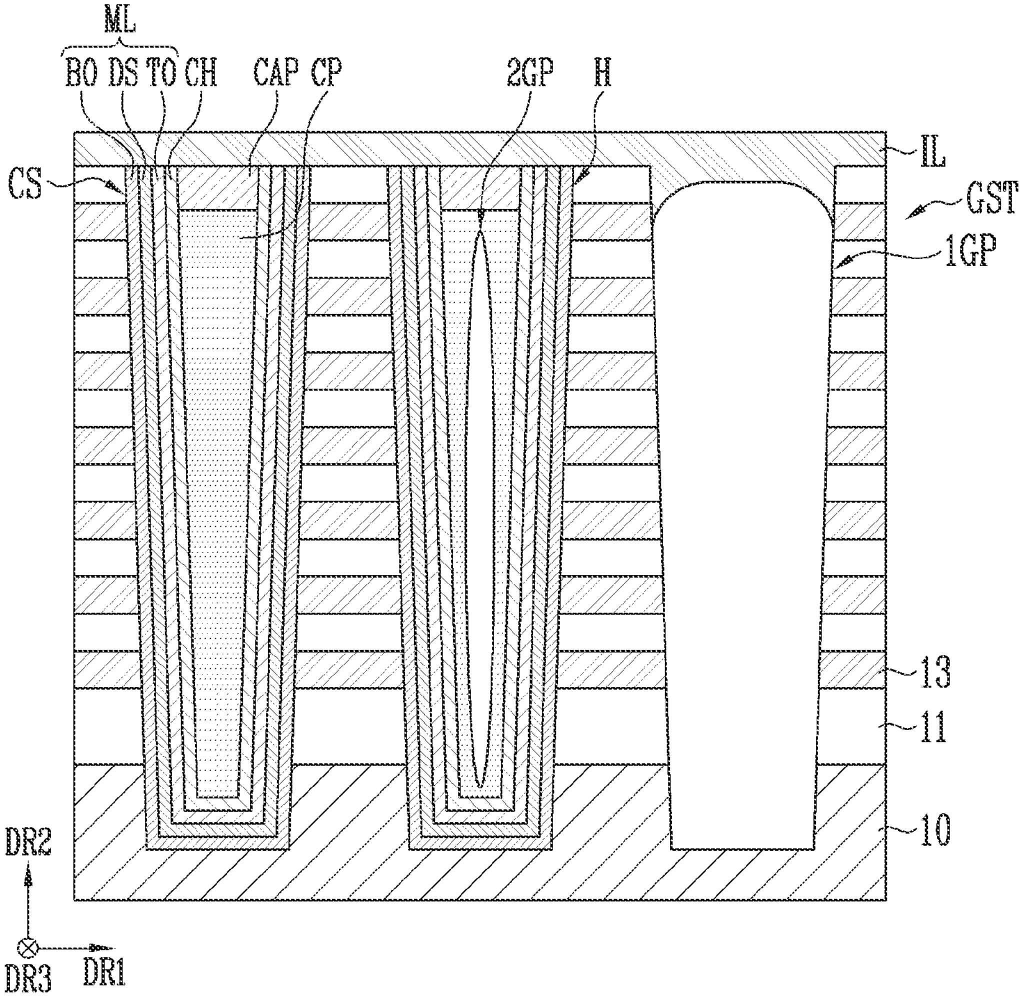

Referring to FIG. 4D, after the channel structure CS is formed, an insulating layer IL may be formed. The insulating layer IL may cover the gate stack structure GST and the channel structure CS. The insulating layer IL might not fill the first gap 1GP, and the first gap 1GP may still be included in the gate stack structure GST. According to an embodiment, a portion of the insulating layer IL may infiltrate into the first gap 1GP. As a result, the area of the first gap 1GP in the gate stack structure GST may be reduced by the insulating layer IL. However, a portion of the first gap 1GP may still remain in the gate stack structure GST.

A slit may pass through the insulating layer IL and the preliminary gate stack structure PGST as shown in FIG. 4C. Though not shown in FIG. 4D, the slit may correspond to the slit SLT as shown in FIG. 3.

According to an embodiment, as described above with reference to FIG. 4A, when the second material layers 12 in FIG. 4C includes a sacrificial insulating material, the second material layers 12 of FIG. 4C may be replaced by the third material layers 13 through the slit. More specifically, the first material layers 11 may remain, and an etch process may be performed using an etchant by which the second material layers 12 of FIG. 4C are selectively removed. Subsequently, third material layers 13 may be inserted into regions from which the second material layers 12 are removed. Each of the third material layers 13 may 13 may extend in the first direction DR1 and the third direction DR3 and surround the channel structure CS. Each of the third material layers 13 may be formed between the first material layers 11 adjacent to each other in the second direction DR2. Each of the third material layers 13 may include at least one of a doped silicon layer, a metal layer, and a conductive metal nitride layer. According to an embodiment, the gate stack structure GST in which interlayer insulating layers (e.g., the first material layers 11) and conductive patterns (e.g., the third material layers 13) are alternately stacked on each other may be divided by the slit forming process and the replacement process.

According to another embodiment, as described above with reference to FIG. 4A, when the second material layers 12 of FIG. 4C include a conductive material, the gate stack structure GST which is partitioned by the slit may be formed without a replacement process. The conductive patterns of the gate stack structure GST may include the second material layers 12 as shown in FIG. 4C and may be partitioned by the slit.

As described above, the conductive patterns of the gate stack structure GST provided by various methods may serve as the drain select line DSL, the plurality of word lines WL, and the source select line SSL as shown in FIG. 1. According to an embodiment, the third material layers 13 may be divided into a lower third material layer adjacent to the substrate 10, an upper third material layer spaced apart from the lower third material layer in the second direction DR2, and a plurality of intermediate third material layers between the lower third material layer and the upper third material layer. The lower third material layer may serve as the source select line SSL as shown in FIG. 1. The plurality of intermediate third material layers may serve as the plurality of word lines WL as shown in FIG. 1. The upper third material layer may serve as the drain select line DSL.

Subsequently, a process of filling the slit with at least one of an insulating material and a conductive material may be performed. Similarly to the first gap 1GP or the second gap 2GP, a third gap (not shown) may be defined in the slit. A description of a subsequent process for the third gap is omitted because it is similar to the subsequent process for the first gap 1GP.

Figure 4E:
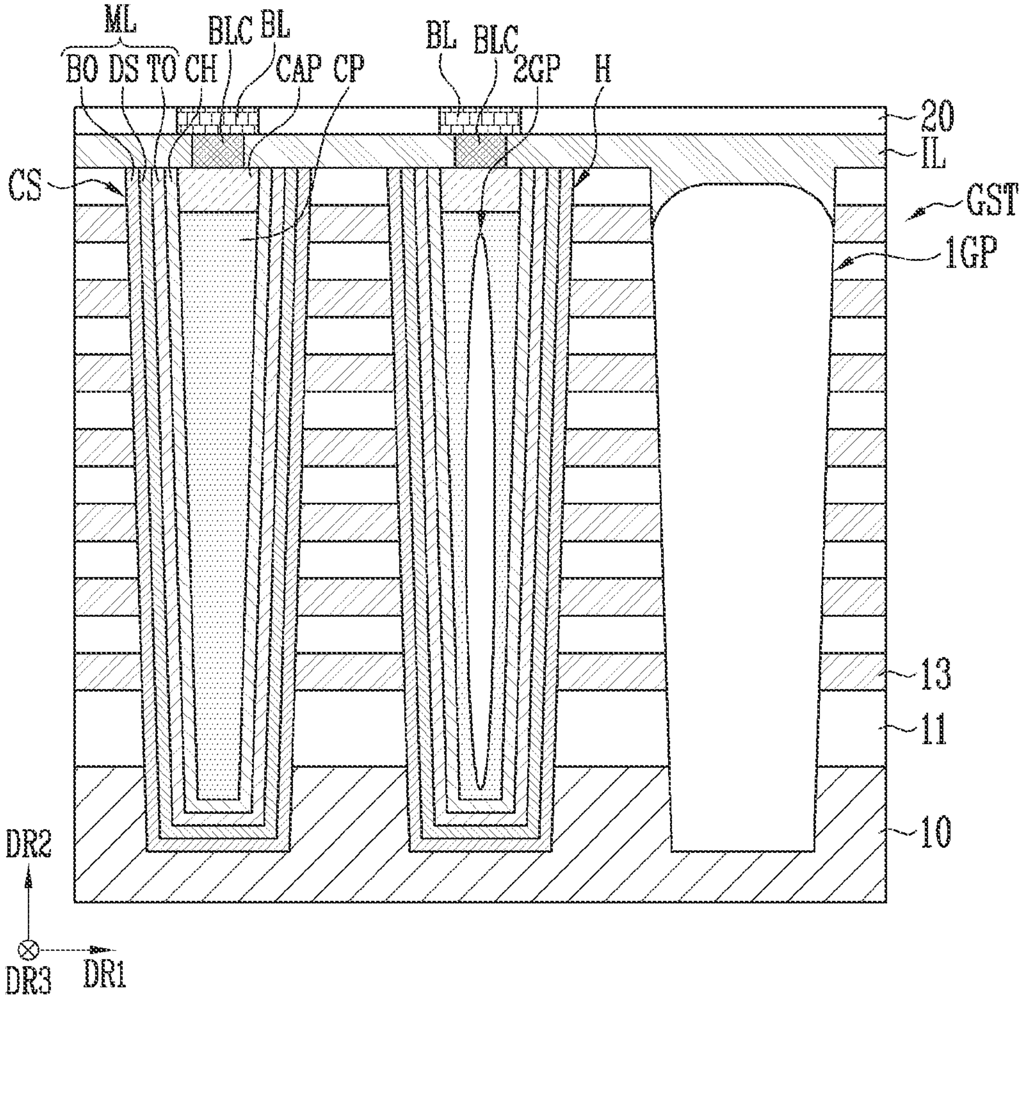

Referring to FIG. 4E, a bit line contact BLC may be formed in the insulating layer IL and pass through the insulating layer IL. The bit line contact BLC may be formed at top of the channel structure CS. The bit line contact BLC may be coupled to the capping layer CAP. The bit line BL may be formed on top of the insulating layer IL. The bit line BL may be electrically coupled to the channel structure CS through the bit line contact BLC. According to an embodiment, the bit line BL may pass through a bit line insulating layer 20 disposed on the insulating layer IL.

By the above-described processes, as shown in FIG. 3, the bit lines BL1 to BLj may overlap the gate stack structures GST1 and GST2 to GSTi in FIG. 3. The bit line BL as shown in FIG. 4E may correspond to portions of the bit lines BL1 to BLj of FIG. 3.

Subsequently, a process for forming a plurality of conductive bonding pads may be performed on the bit line BL, and a bonding process for bonding the plurality of conductive bonding pads to a structure including a separately provided peripheral circuit may be performed. To perform the bonding process, the structure described with reference to FIG. 4E may be vertically inverted so that the gate stack structure GST may face the peripheral circuit. Subsequent processes are described based on the vertically inverted gate stack structure GST.

Figure 4F:
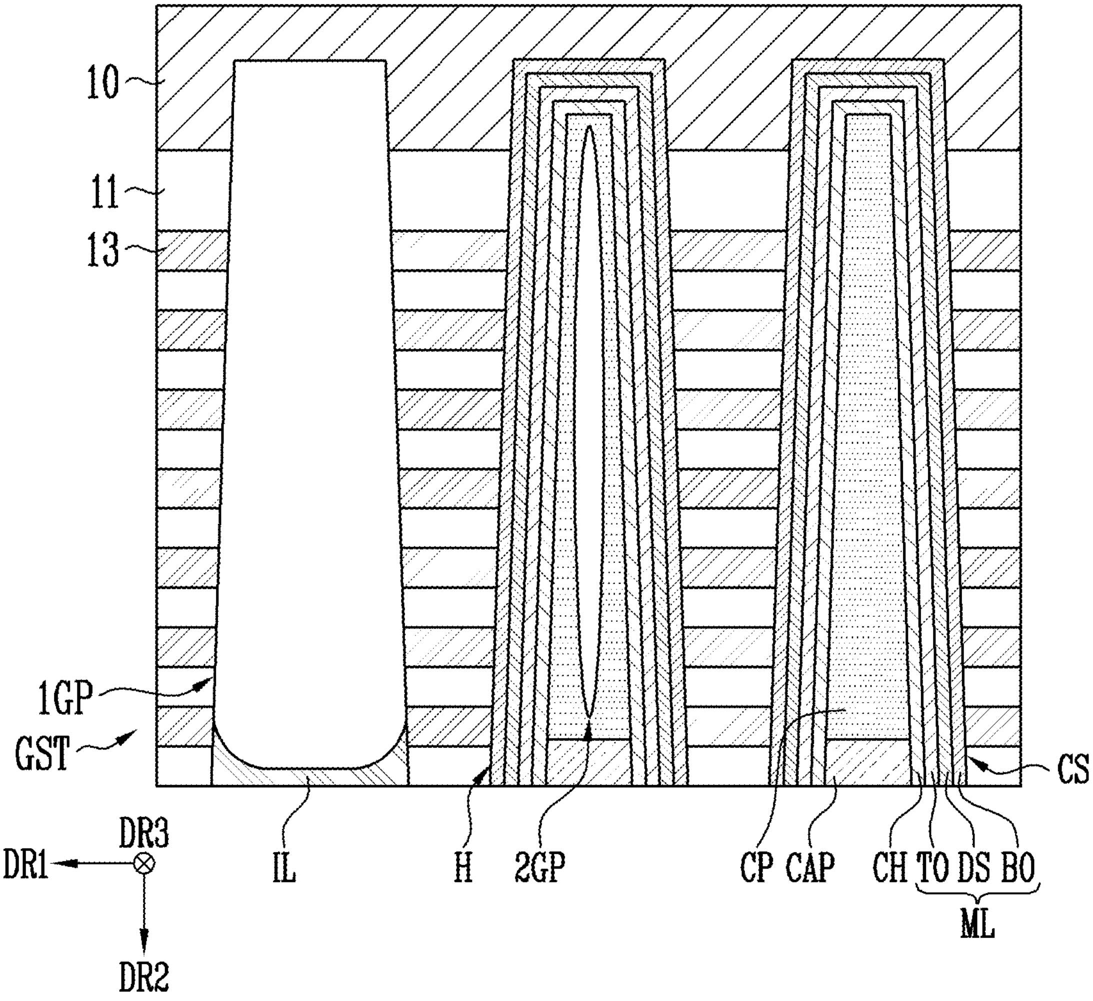

FIGS. 4F to 4K are cross-sectional diagrams illustrating an embodiment for subsequent processes performed after the bonding process. For simplicity of illustration, the bit line BL of FIG. 4E and the bit line contact BLC of FIG. 4E are omitted from FIGS. 4F to 4K, and only a portion of the insulating layer IL formed in the first gap 1GP is shown. Referring to FIG. 4F, after the bonding process, at least one of the first gap 1GP in the gate stack structure GST and the second gap 2GP in the channel structure CS may remain.

According to the processes described with reference to FIGS. 4A to 4E, a portion of the channel structure CS and a portion of the memory layer ML may protrude toward the substrate 10 more than the gate stack structure GST. More specifically, a portion of the channel structure CS which extends into the substrate 10 may be defined as a protrusion PP which protrudes towards the substrate 10 more than the gate stack structure GST. The protrusion PP may include a portion of the memory layer ML and a portion of the channel layer CH which extend into the substrate 10.

Figure 4G:
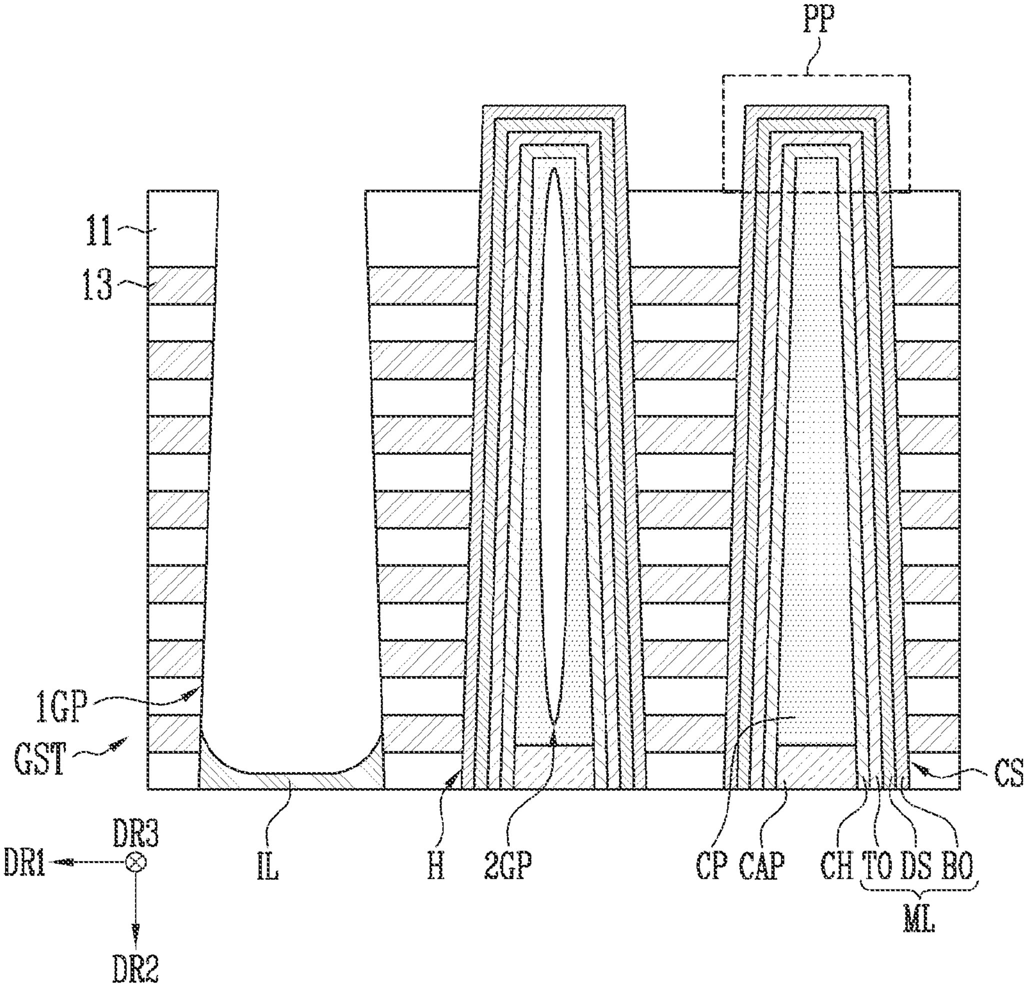

Referring to FIG. 4G, the substrate 10 as shown in FIG. 4F may be removed after the bonding process. A portion of the memory layer ML may be exposed to the outside by removing the substrate 10 of FIG. 4F. More specifically, the portion of the memory layer ML which forms the protrusion PP of the channel structure CS may be exposed to the outside. In addition, the first gap 1GP may be opened by removing the substrate 10 of FIG. 4F.

Figure 4H:
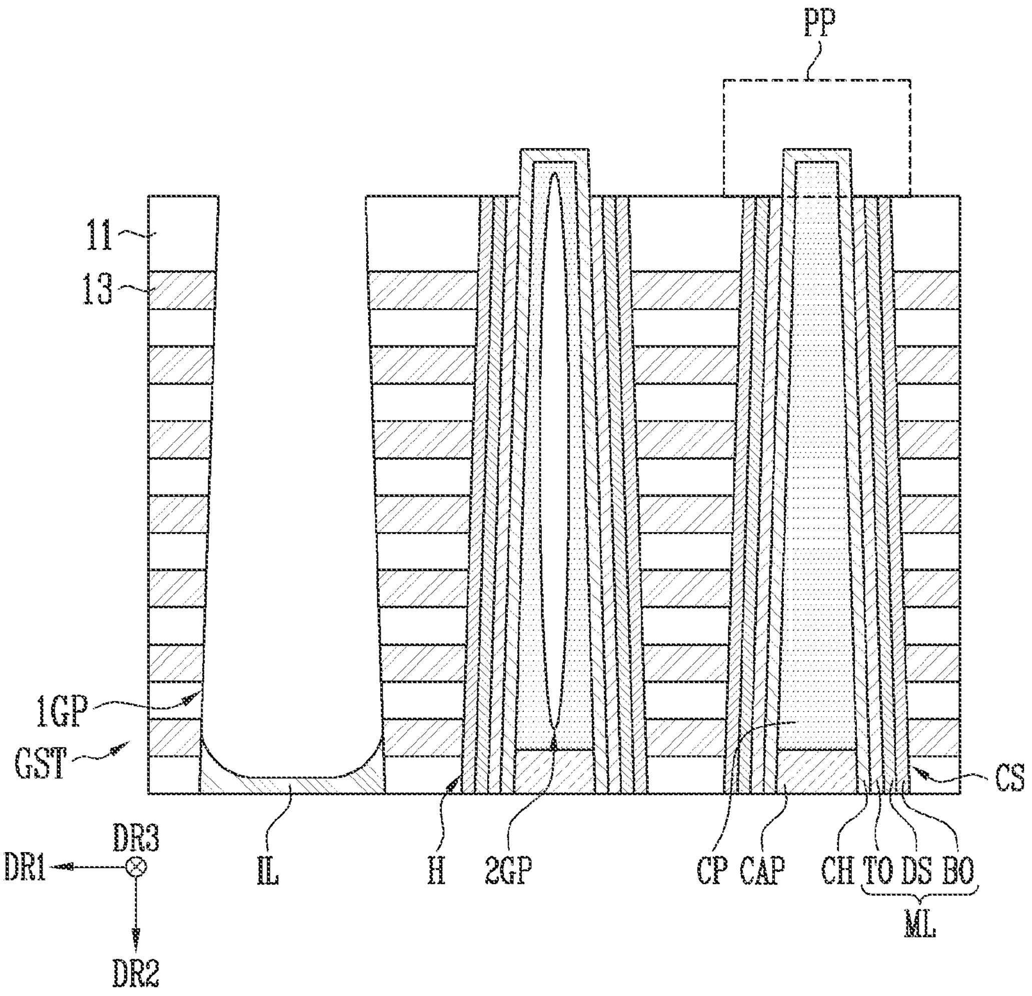

Referring to FIG. 4H, a portion of the channel structure CS may be etched. More specifically, the portion of the memory layer ML which forms the protrusion PP of the channel structure CS may be etched. In other words, a portion of each of the blocking layer BO, the data storage layer DS, and the tunnel isolation layer TO which protrude more than the gate stack structure GST may be etched. As a result, the portion of the channel layer CH which forms the protrusion PP of the channel structure CS may be exposed to the outside. The blocking layer BO, the data storage layer DS, and the tunnel isolation layer TO between the gate stack structure GST and the channel layer CH may remain without being etched.

Figure 4I:
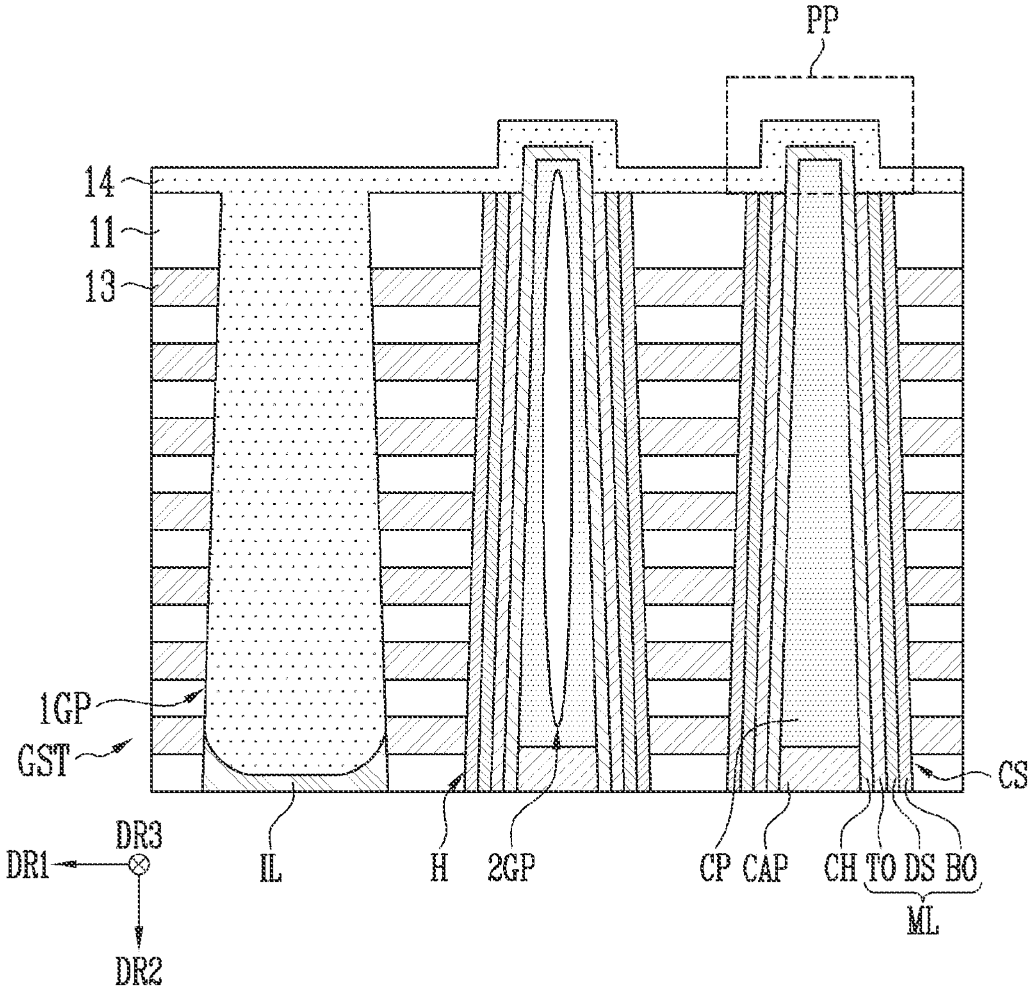

Referring to FIG. 4I, an upper insulating layer 14 may be formed to cover a portion of the exposed channel layer CH and the gate stack structure GST. The upper insulating layer 14 may be formed along the contour of the exposed channel layer CH and the gate stack structure GST. The upper insulating layer 14 may extend into the first gap 1GP. According to an embodiment, the upper insulating layer 14 may fill the entire first gap 1GP, as illustrated. In another embodiment, the upper insulating layer 14 might only fill a portion of the first gap 1GP. The upper insulating layer 14 may block the first gap 1GP from being exposed to the outside.

The upper insulating layer 14 may include an insulating material to block an electrical connection between a source layer to be formed in a subsequent process and the third material layers 13. For example, the upper insulating layer 14 may include an oxide or a silicon oxide such as $SiO_2$. According to an embodiment, the upper insulating layer 14 may include the same material as the core pillar CP. For example, the upper insulating layer 14 and the core pillar CP may include a silicon oxide such as $SiO_2$.

Figure 4J:
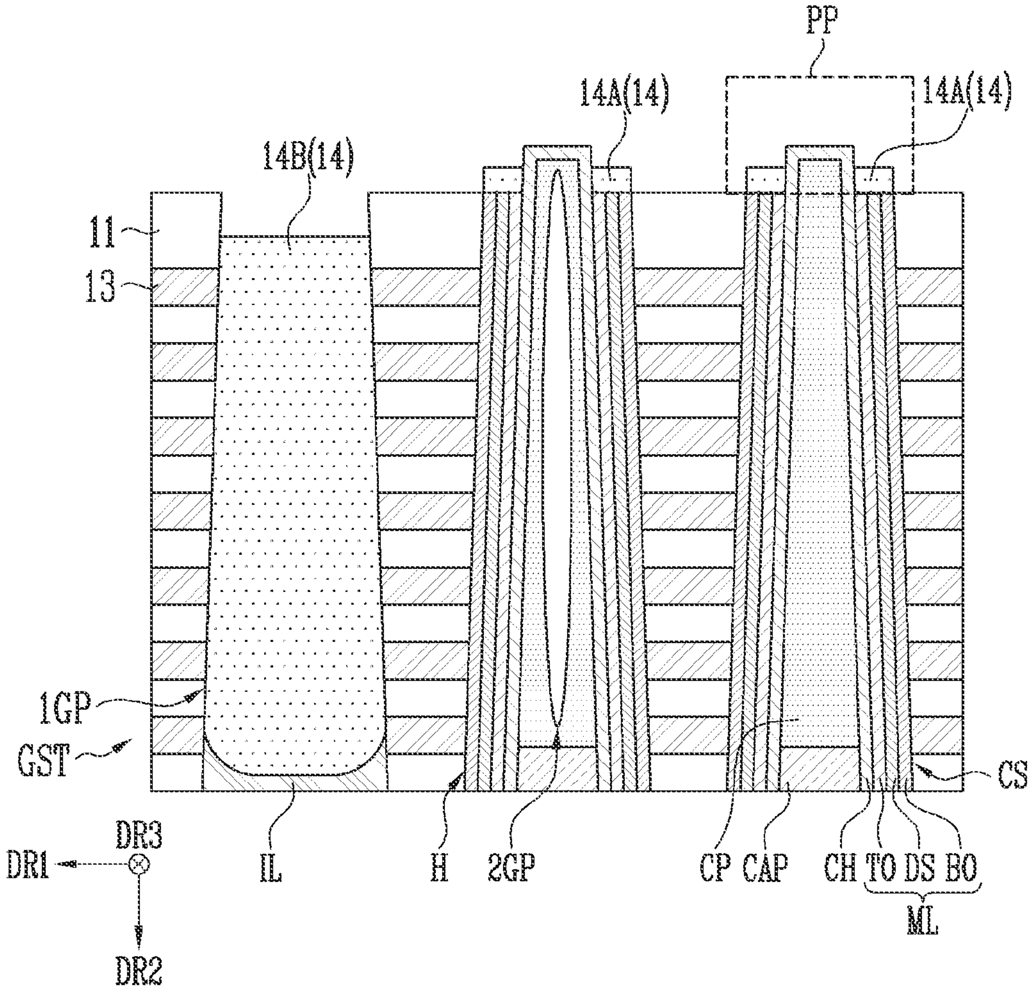

Referring to FIG. 4J, a portion of the upper insulating layer 14 may be etched. The upper insulating layer 14 may be etched to expose the portion of the channel layer CH which forms the protrusion PP. The etch process of the upper insulating layer 14 may be controlled so that portions of the upper insulating layer 14 may remain in the first gap 1GP and on the sidewall of the channel layer CH which forms the protrusion PP. According to an embodiment, the portion of the upper insulating layer 14 which surrounds the sidewall of the portion of the channel layer CH which forms the protrusion PP may remain as a spacer insulating pattern 14A. According to an embodiment, the portion of the upper insulating layer 14 which extends into the remaining first gap 1GP may remain as a vertical insulating pattern 14B. The spacer insulating pattern 14A may overlap the memory layer ML between the gate stack structure GST and the channel layer CH. The spacer insulating pattern 14A may cover the memory layer ML. The vertical insulating pattern 14B may fill at least a portion of the first gap 1GP. According to an embodiment, a sidewall of the vertical insulating pattern 14B may cover sidewalls of the third material layers 13. The vertical insulating pattern 14B may prevent the third material layers 13 from being exposed to the outside. According to an embodiment, a level of the vertical insulating pattern 14B may be higher than a level of the uppermost third material layer 13 among the third material layers 13.

Figure 4K:
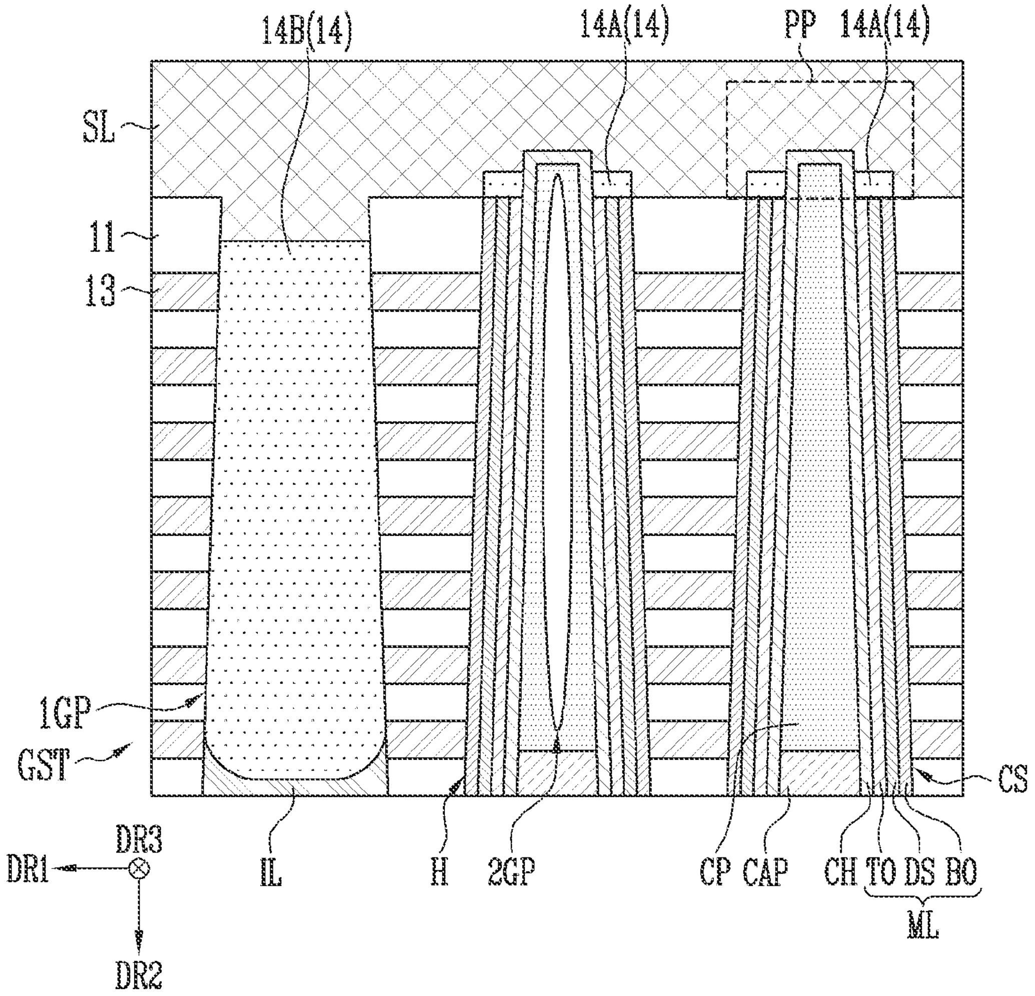

Referring to FIG. 4K, the source layer SL may be formed to cover the gate stack structure GST. The source layer SL may include a conductive material. According to an embodiment, the source layer SL may include at least one of a doped semiconductor layer, a metal silicide layer, and a metal layer. The source layer SL may be formed to cover a portion of the channel layer CH which protrudes more than the gate stack structure GST and the spacer insulating pattern 14A. The source layer SL may be coupled to the channel layer CH. The source layer SL may cover the vertical insulating pattern 14B. According to an embodiment, when a level of the vertical insulating pattern 14B is lower than a level of the gate stack structure GST, the source layer SL may cover a portion of the sidewall of the first gap 1GP.

As the vertical insulating pattern 14B is disposed in the first gap 1GP, an electrical connection between the source layer SL and the third material layers 13 may be blocked. According to an embodiment, without performing the process of forming the vertical insulating pattern 14B, the source layer SL may be formed on the gate stack structure GST. In this embodiment, the conductive material for the source layer SL may infiltrate into the first gap 1GP and cause the source layer SL to be electrically coupled to the third material layers 13. According to an embodiment of the present disclosure, the vertical insulating pattern 14B may prevent the conductive material for the source layer SL from infiltrating into the first gap 1GP and being coupled to the third material layers 13. Accordingly, in the present disclosure, the operational reliability of the semiconductor device may be improved.

FIGS. 5A to 5D are diagrams illustrating a method of manufacturing a memory device according to an embodiment of the present disclosure. FIGS. 5A to 5D are cross-sectional views illustrating embodiments with respect to subsequent process performed after the processes of FIGS. 4A to 4F are performed.

Figure 5A:
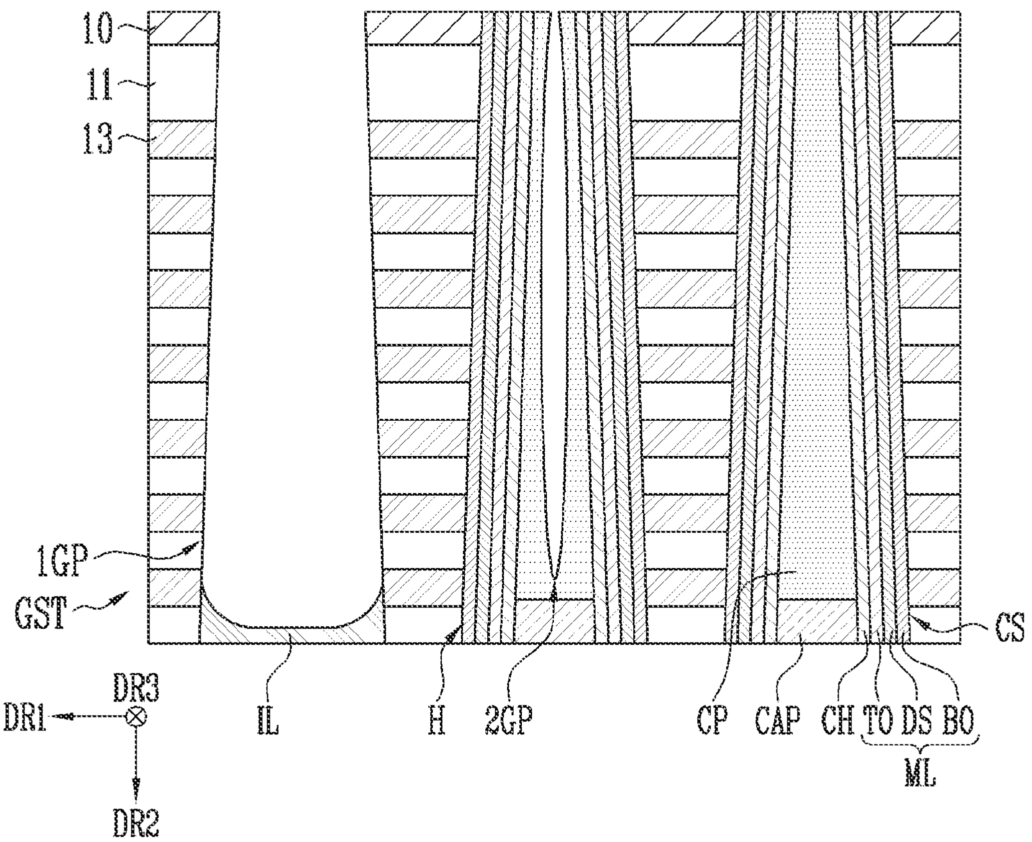
FIGS. 5A to 5D are diagrams illustrating a method of manufacturing a memory device according to an embodiment of the present disclosure.

Referring to FIG. 5A, at least a portion of the substrate 10 and a portion of the memory layer ML may be removed. According to an embodiment, an etch process may be controlled so that a portion of the substrate 10 as shown in FIG. 4F may be removed and a portion of the substrate 10 adjacent to the gate stack structure GST may remain. The memory layer ML may remain between the substrate 10 and the channel layer CH and between the gate stack structure GST and the channel layer CH.

As the portion of the substrate 10 and the portion of the memory layer ML are etched, the first gap 1GP may be exposed to the outside.

A portion of the channel layer CH may be removed by removing the portion of the substrate 10 and the portion of the memory layer ML. As a result, the second gap 2GP in the channel structure CS may be exposed to the outside.

However, the portion of the channel layer CH between the memory layer ML and the core pillar CP might not be removed and may remain. A portion of the remaining channel layer CH may include an exposed surface facing a direction opposite to the second direction DR2.

Figure 5B:
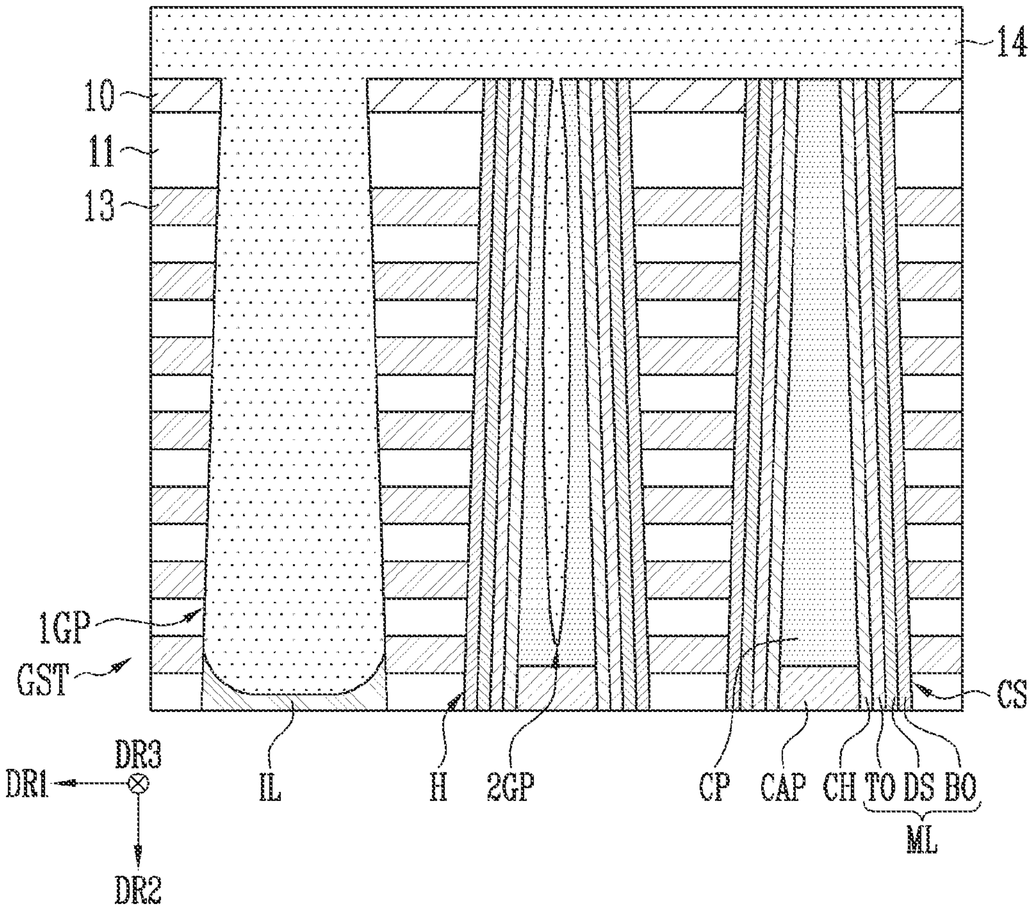

Referring to FIG. 5B, the upper insulating layer 14 may be formed to cover a portion of the exposed channel layer CH and the gate stack structure GST. The upper insulating layer 14 may extend into the first gap 1GP. According to an embodiment, the upper insulating layer 14 may fill the entire first gap 1GP. In another embodiment, the upper insulating layer 14 may fill a portion of the first gap 1GP. The upper insulating layer 14 may be formed to cover the third material layers 13 which are exposed on the sidewall of the first gap 1GP. The upper insulating layer 14 may extend into the second gap 2GP. According to an embodiment, the upper insulating layer 14 may be coupled to the core pillar CP in the channel structure CS through the second gap 2GP.

Figure 5C:
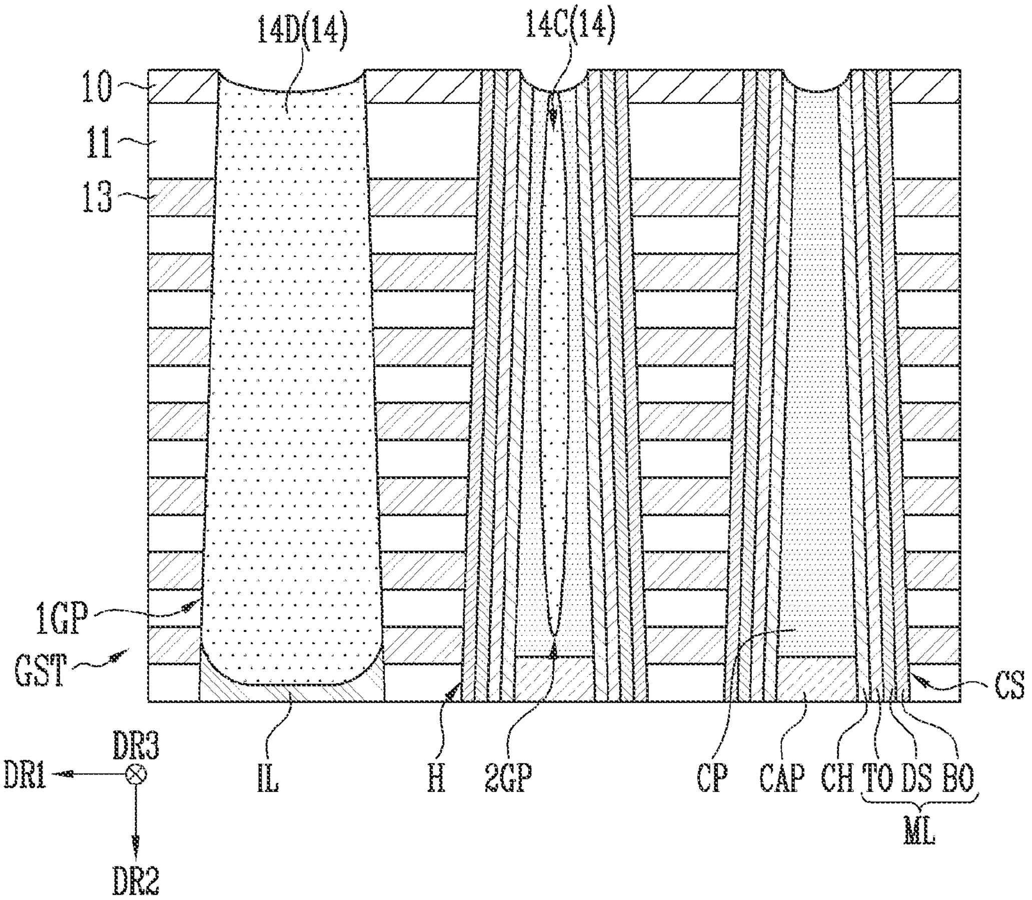

Referring to FIG. 5C, a portion of the upper insulating layer 14 may be removed to expose the channel layer CH. A process of removing the portion of the upper insulating layer 14 may be controlled so that another portion of the upper insulating layer 14 may remain.

According to an embodiment, the portion of the upper insulating layer 14 which extends into the first gap 1GP may remain as a vertical insulating pattern 14D. The vertical insulating pattern 14D may fill at least a portion of the first gap 1GP. According to an embodiment, a sidewall of the vertical insulating pattern 14D may cover sidewalls of the third material layers 13. The vertical insulating pattern 14D may prevent the third material layers 13 from being exposed to the outside. According to an embodiment, a level of the vertical insulating pattern 14D may be higher than a level of the uppermost third material layer 13 among the third material layers 13. A process for etching the portion of the upper insulating layer 14 may be controlled to form the vertical insulating pattern 14D.

According to an embodiment, the portion of the upper insulating layer 14 which extends into the second gap 2GP may remain as a filling insulating pattern 14C. According to an embodiment, the filling insulating pattern 14C may fill the entire second gap 2GP. In another embodiment, the filling insulating pattern 14C may fill a portion of the second gap 2GP. According to an embodiment, a portion of the core pillar CP may be removed during the process of removing the portion of the upper insulating layer 14. The core pillar CP may remain while surrounding the filling insulating pattern 14C.

The filling insulating pattern 14C and the vertical insulating pattern 14D may include the same material because these patterns correspond to portions of the upper insulating layer 14. According to an embodiment, the upper insulating layer 14 may include the same material as the core pillar CP. The filling insulating pattern 14C and the core pillar CP may include the same material. For example, the filling insulating pattern 14C and the core pillar CP may include a silicon oxide such as $SiO_2$.

Figure 5D:
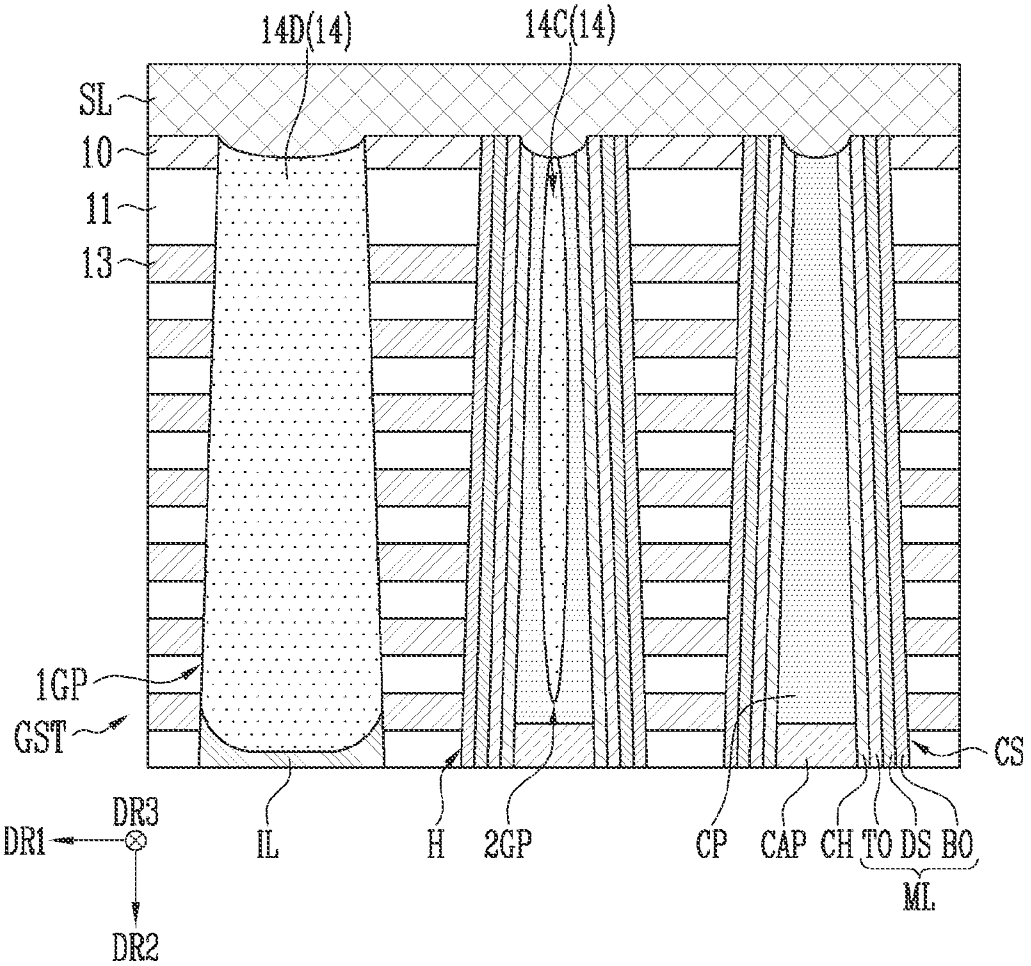

Referring to FIG. 5D, the source layer SL may be formed to cover a portion of the exposed channel layer CH and the gate stack structure GST. The source layer SL may be formed to cover the channel layer CH, the filling insulating pattern 14C, and the vertical insulating pattern 14D. More specifically, the source layer SL may cover the gate stack structure GST and contact end portions of the filling insulating pattern 14C and the channel layer CH. In addition, the source layer SL may contact an end portion of the vertical insulating pattern 14D. According to an embodiment, the source layer SL may be separated from the gate stack structure GST with the substrate 10 interposed therebetween. According to an embodiment, the source layer SL may protrude toward the filling insulating pattern 14C. More specifically, the protrusion of the source layer SL may overlap the filling insulating pattern 14C. According to an embodiment, the source layer SL may protrude toward the vertical insulating pattern 14D. More specifically, the protrusion of the source layer SL may overlap the vertical insulating pattern 14D. The source layer SL may include a conductive material. According to an embodiment, the source layer SL may include at least one of a doped semiconductor layer, a metal silicide layer, and a metal layer.

Because the filling insulating pattern 14C fills at least a portion of the second gap 2GP, the filling insulating pattern 14C may prevent the source layer SL from infiltrating into the second gap 2GP and overlapping the third material layers 13. According to an embodiment, when the source layer SL is formed at the same level as the third material layers 13, a leakage current between the third material layers 13 and the source layer SL may increase. According to an embodiment, because the leakage current may be reduced by the filling insulating pattern 14C, the operational reliability of the memory device may be improved.

As the vertical insulating pattern 14D extends into the first gap 1GP, an electrical connection between the source layer SL and the third material layers 13 may be blocked.

Figure 6A:
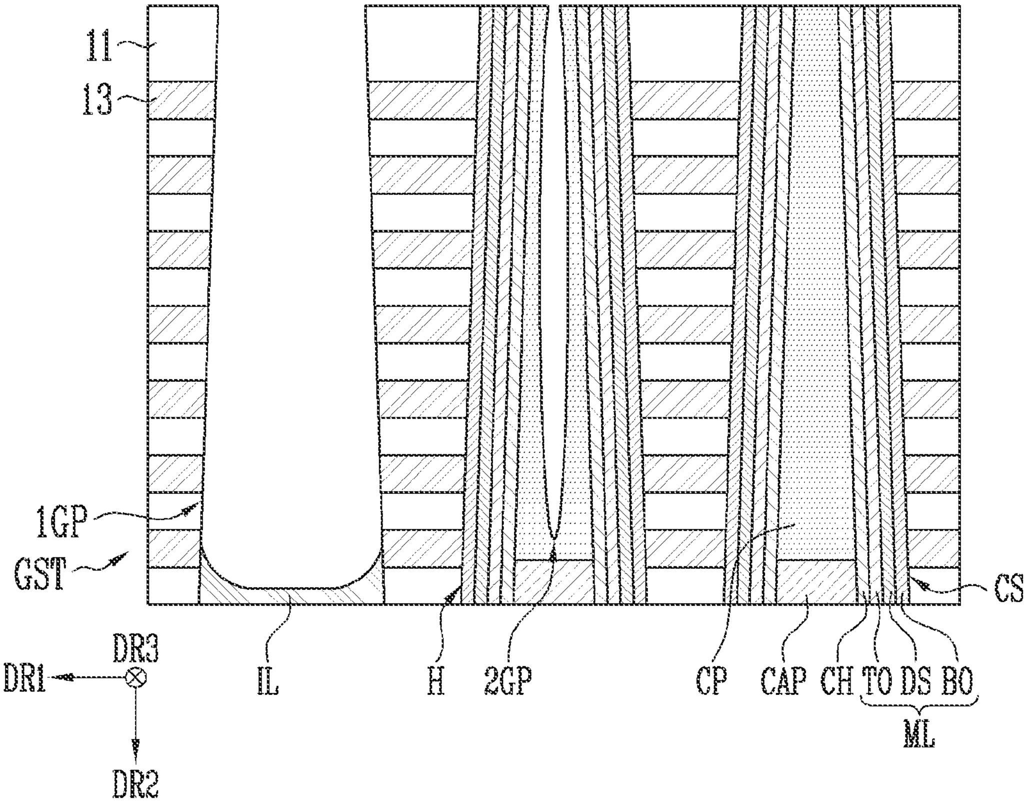
FIGS. 6A and 6B are diagrams illustrating a method of manufacturing a memory cell array according to an embodiment of the present disclosure.
Figure 6B:
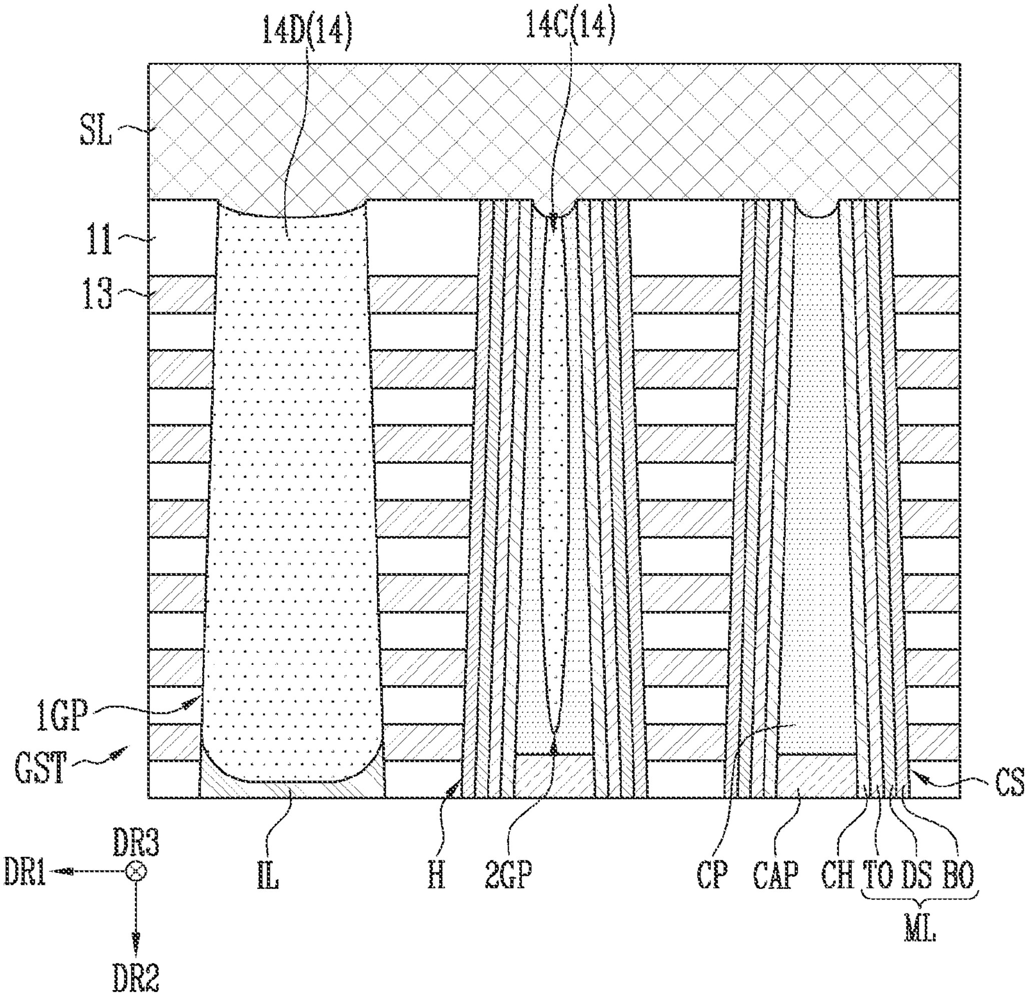

FIGS. 6A and 6B are diagrams illustrating a method of manufacturing a memory cell array according to an embodiment of the present disclosure. FIGS. 6A and 6B are cross-sectional views illustrating embodiments with respect to subsequent process performed after the above-described processes of FIGS. 4A to 4F are performed.

Referring to FIG. 6A, at least a portion of the substrate 10 and a portion of the memory layer ML may be removed. According to an embodiment, an etch process may be controlled such that the entire substrate 10 of FIG. 4F may be removed to expose the gate stack structure GST. The memory layer ML may remain between the gate stack structure GST and the channel layer CH.

As described above with reference to FIG. 5A, the portion of the channel layer CH may be removed while the portions of the substrate 10 and the memory layer ML are etched. As a result, the first gap 1GP and the second gap 2GP may be exposed to the outside. As described above with reference to FIG. 5A, the portion of the remaining channel layer CH may include the exposed surface facing a direction opposite to the second direction DR2.

Referring to FIG. 6B, the same processes as those described above with reference to FIGS. 5B to 5D may be performed. Accordingly, in the same manner as described above with reference to FIG. 5C, the vertical insulating pattern 14D may be formed in the first gap 1GP, and the filling insulating pattern 14C may be formed in the second gap 2GP. According to an embodiment of the present disclosure, because the source layer SL is formed when the gate stack structure GST is exposed, the source layer SL may contact the first material layers 11 of the gate stack structure GST.

As described above with reference to FIG. 5D, the filling insulating pattern 14C may prevent the source layer SL from infiltrating into the second gap 2GP, and the vertical insulating pattern 14D may block an electric connection between the source layer SL and the third material layers 13.

Figure 7:
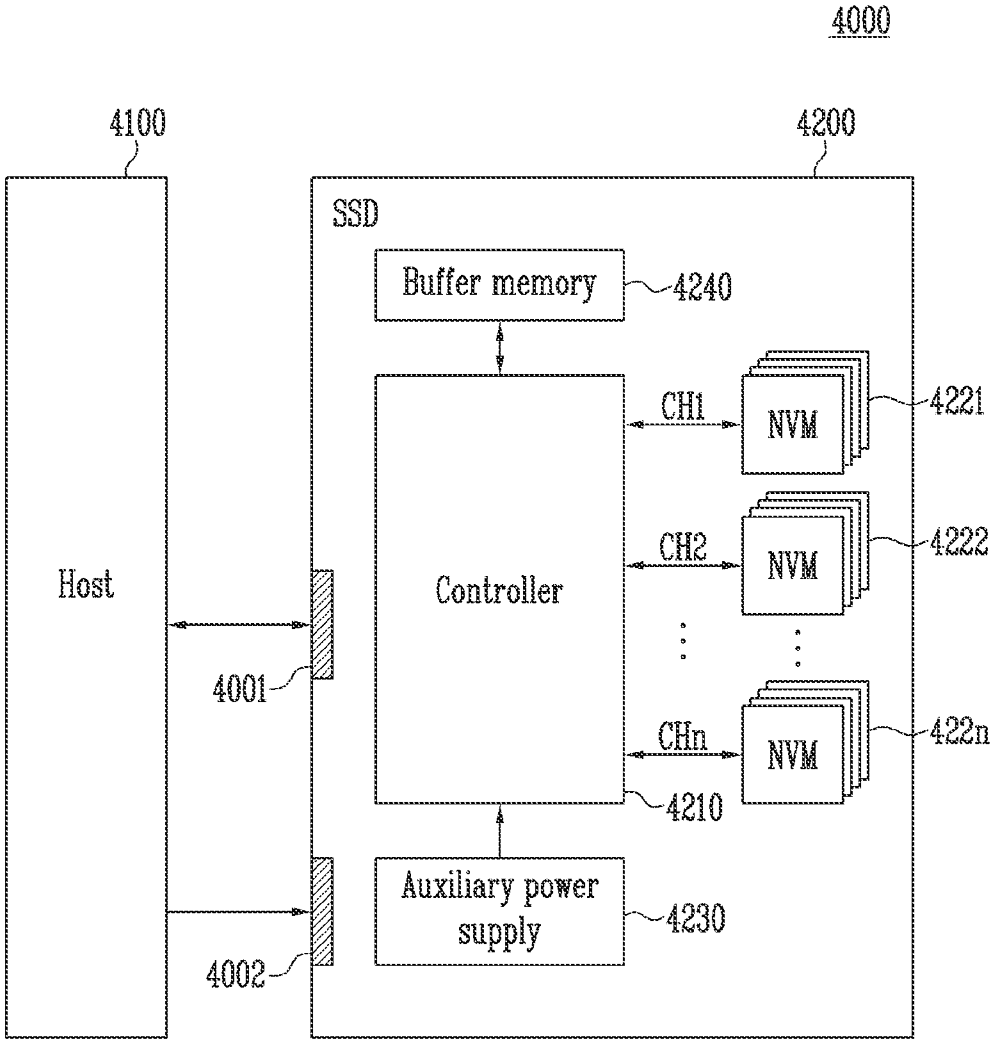
FIG. 7 is a diagram illustrating a solid-state drive (SSD) system to which a memory device according to an embodiment of the present disclosure is applied.

FIG. 7 is a diagram illustrating a solid-state drive (SSD) system 4000 to which a memory device according to an embodiment of the present disclosure is applied.

Referring to FIG. 7, the SSD system 4000 may include a host 4100 and an SSD 4200. The SSD 4200 may exchange signals with the host 4100 through a signal connector 4001 and may receive power through a power connector 4002. The SSD 4200 may include a controller 4210, a plurality of memory devices 4221 to **422*n*, an auxiliary power supply 4230, and a buffer memory 4240**.

The controller 4210 may control the plurality of memory devices 4221 to **422*n* in response to the signals received from the host 4100. In an embodiment, the signals may be based on the interfaces of the host 4100 and the SSD 4200**. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The plurality of memory devices 4221 to **422*n* may include a plurality of memory cells which are configured to store data. Each of the plurality of memory devices 4221 to 422*n* may have the same configuration as the memory device 100 as shown in FIG. 1. More specifically, each of the plurality of memory devices 4221 to 422*n* may include at least one of the memory devices as shown in FIGS. 2, 3, 4K, 5D, and 6B. More specifically, each of the memory devices may include a memory cell array overlapping the peripheral circuit. According to an embodiment, each of the memory devices may include a gate stack structure including interlayer insulating layers and conductive patterns stacked alternately with each other; a channel layer including a protrusion protruding more than the gate stack structure; a memory layer interposed between the channel layer and the gate stack structure; a spacer insulating pattern surrounding a sidewall of the protrusion and overlapping the memory layer; and a source layer covering the gate stack structure and the spacer insulating pattern and contacting the protrusion of the channel layer. According to another embodiment, each of the memory devices may include a gate stack structure including interlayer insulating layers and conductive patterns stacked alternately with each other and a channel hole passing through the interlayer insulating layers and the conductive patterns; a channel layer disposed in the channel hole; a memory layer interposed between the channel layer and the gate stack structure; a gap in the channel hole surrounded by the channel layer; a filling insulating pattern in the gap; and a source layer covering the gate stack structure and contacting end portions of the filling insulating pattern and the channel layer. The plurality of memory devices 4221 to 422*n* may communicate with the controller 4210 through channels CH1** to CHn.

The auxiliary power supply 4230 may be coupled to the host 4100 through the power connector 4002. The auxiliary power supply 4230 may be supplied and charged with the power from the host 4100. The auxiliary power supply 4230 may supply the power of the SSD 4200 when the power is not smoothly supplied from the host 4100. In an embodiment, the auxiliary power supply 4230 may be positioned inside or outside the SSD 4200. For example, the auxiliary power supply 4230 may be disposed in a main board and supply auxiliary power to the SSD 4200.

The buffer memory 4240 may serve as a buffer memory of the SSD 4200. For example, the buffer memory 4240 may temporarily store data received from the host 4100 or data received from the plurality of memory devices 4221 to **422*n*, or may temporarily store metadata (e.g., mapping tables) of the memory devices 4221 to 422*n*. The buffer memory 4240** may include volatile memories such as DRAM, SDRAM, DDR SDRAM, LPDDR SDRAM, and GRAM, or nonvolatile memories such as FRAM, ReRAM, STT-MRAM, and PRAM.

Figure 8:
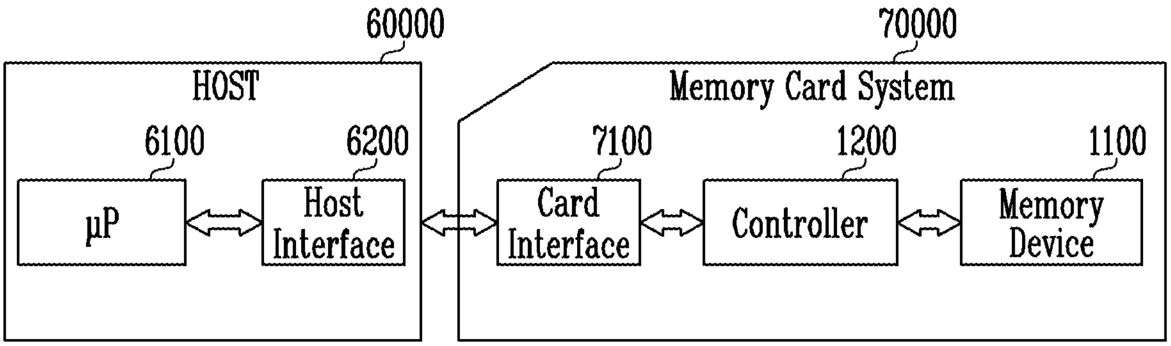
FIG. 8 is a diagram illustrating a memory card system to which a memory device according to an embodiment of the present disclosure is applied.

FIG. 8 is a diagram illustrating a memory card system 70000 to which a memory device according to an embodiment of the present disclosure is applied.

Referring to FIG. 8, the memory card system 70000 may include a memory card or a smart card. The memory card system 70000 may include a memory device 1100, a controller 1200, and a card interface 7100.

The controller 1200 may control data exchange between the memory device 1100 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the controller 1200 according to a protocol of the host 60000. According to an embodiment, the card interface 7100 may 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory card system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor 6100.

According to some embodiments of the present disclosure, the reliability of a memory device may be increased.

It will be apparent to those skilled in the art that various modifications can be made to the above-described embodiments of the present teachings without departing from the spirit or scope of the present teachings. Thus, it is intended that the present teachings cover all such modifications provided they come within the scope of the appended claims and their equivalents.

What is claimed is:

1. A method of manufacturing a memory device, the method comprising:

forming a preliminary gate stack structure including a plurality of interlayer insulating layers and a plurality of sacrificial patterns stacked alternately with each other on a substrate, a channel hole passing through the preliminary gate stack structure and extending into the substrate, a memory layer extending along a surface of the channel hole, and a channel layer extending along a surface of the memory layer;

forming a gate stack structure by replacing the plurality of sacrificial patterns with a plurality of conductive patterns;

removing the substrate to expose the memory layer;

removing a portion of the memory layer to expose a portion of the channel layer;

forming an upper insulating layer to cover the portion of the channel layer and the gate stack structure;

removing a portion of the upper insulating layer to expose at least a portion of the portion of the channel layer; and forming a source layer covering the at least a portion of the portion of the channel layer and the upper insulating layer.

2. The method of claim 1, wherein the gate stack structure includes a first gap passing through the plurality of interlayer insulating layers and the plurality of conductive patterns, and wherein the upper insulating layer extends into the first gap.

3. The method of claim 2, wherein the first gap is the channel hole not including the memory layer and the channel layer.

4. The method of claim 1, wherein the upper insulating layer is an oxide.

5. The method of claim 1, wherein the channel layer includes a protrusion protruding toward the substrate more than the gate stack structure, wherein the protrusion of the channel layer is exposed after the removing of the substrate and the removing of the portion of the memory layer, and wherein the upper insulating layer covers the protrusion of the channel layer.

6. The method of claim 5, wherein a portion of the protrusion of the channel layer is exposed when the portion of the upper insulating layer is removed.

7. A method of manufacturing a memory device, the method comprising:

forming a preliminary gate stack structure including a plurality of interlayer insulating layers and a plurality of sacrificial patterns stacked alternately with each other on a substrate, a channel hole passing through the preliminary gate stack structure and extending into the substrate, a memory layer extending along a surface of the channel hole, and a channel layer extending along a surface of the memory layer;

forming a gate stack structure by replacing the plurality of sacrificial patterns with a plurality of conductive patterns;

removing a portion of the memory layer and at least a portion of the substrate to expose a portion of the channel layer;

forming an upper insulating layer to cover the portion of the channel layer and the gate stack structure;

removing a portion of the upper insulating layer to expose another portion of the channel layer; and forming a source layer covering the another portion of the channel layer and the upper insulating layer.

8. The method of claim 7, wherein the gate stack structure includes a first gap passing through the plurality of interlayer insulating layers and the plurality of conductive patterns, and the upper insulating layer extends into the first gap.

9. The method of claim 7, wherein the channel hole includes a second gap surrounded by the channel layer, and the upper insulating layer extends into the second gap.

10. The method of claim 9, further comprising forming a core pillar surrounded by the channel layer, wherein the second gap is disposed in the core pillar.

11. The method of claim 9, wherein the portion of the channel layer is removed to expose the second gap to an outside when the portion of the memory layer and the at least the portion of the substrate are removed.

12. The method of claim 7, wherein the removing the portion of the memory layer and the at least portion of the substrate is performed to completely remove the substrate.

13. The method of claim 7, wherein the removing the portion of the memory layer and the at least portion of the substrate is performed such that a portion of the substrate adjacent to the gate stack structure remains.

* * * * *